United States Patent
Lee et al.

(10) Patent No.: US 12,133,342 B2
(45) Date of Patent: Oct. 29, 2024

(54) ELECTRONIC DEVICE INCLUDING A CONDUCTIVE PORTION AND CONTACT MEMBER MAKING CONTACT WITH SUBSTRATE

(71) Applicant: Samsung Electronics Co., Ltd., Gyeonggi-do (KR)

(72) Inventors: Geuna Lee, Gyeonggi-do (KR); Jinho Lim, Gyeonggi-do (KR); Minsu Jung, Gyeonggi-do (KR); Kwonho Son, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 283 days.

(21) Appl. No.: 17/870,977

(22) Filed: Jul. 22, 2022

(65) Prior Publication Data

US 2023/0021646 A1    Jan. 26, 2023

Related U.S. Application Data

(63) Continuation of application No. PCT/KR2022/010833, filed on Jul. 22, 2022.

(30) Foreign Application Priority Data

Jul. 23, 2021    (KR) .................... 10-2021-0097279

(51) Int. Cl.
*H05K 1/18*    (2006.01)
*H04M 1/02*    (2006.01)
(Continued)

(52) U.S. Cl.
CPC ........ *H05K 5/0069* (2013.01); *H04M 1/0277* (2013.01); *H05K 1/189* (2013.01);
(Continued)

(58) Field of Classification Search
CPC .... H05K 5/0069; H05K 1/189; H05K 5/0217; H05K 1/0281; H05K 1/147; H04M 1/0277
(Continued)

(56) References Cited

U.S. PATENT DOCUMENTS

2010/0046179 A1*    2/2010    Arita ..................... G06F 1/1647
                                                          361/752
2015/0062847 A1    3/2015    Park
(Continued)

FOREIGN PATENT DOCUMENTS

JP    2003-273547 A    9/2003
JP    2012-185935 A    9/2012
(Continued)

OTHER PUBLICATIONS

International Search Report dated Nov. 1, 2022.

*Primary Examiner* — Binh B Tran
(74) *Attorney, Agent, or Firm* — Cha & Reiter, LLC

(57) ABSTRACT

According to an embodiment, an electronic device is provided. the electronic device may comprise: a housing including a conductive portion and a non-conductive portion; a first substrate; at least one electronic component disposed on the first substrate; a second substrate electrically coupled to the first substrate, the second substrate including a first surface facing a first direction and a second surface facing a second direction opposite to the first direction; at least one contact member disposed between the first surface of the second substrate and the conductive portion of the housing;
(Continued)

and a support member disposed between the first surface of the second substrate and the non-conductive portion of the housing.

20 Claims, 24 Drawing Sheets

(51) Int. Cl.
    *H05K 5/00*     (2006.01)
    *H05K 5/02*     (2006.01)
    *H05K 1/02*     (2006.01)
    *H05K 1/14*     (2006.01)

(52) U.S. Cl.
    CPC ......... *H05K 5/0217* (2013.01); *H05K 1/0281* (2013.01); *H05K 1/147* (2013.01); *H05K 2201/10151* (2013.01); *H05K 2201/1031* (2013.01); *H05K 2201/2009* (2013.01); *H05K 2201/2036* (2013.01)

(58) Field of Classification Search
    USPC ......................................................... 361/749
    See application file for complete search history.

(56) References Cited

U.S. PATENT DOCUMENTS

| | | |
|---|---|---|
| 2017/0048366 A1 | 2/2017 | Jeong |
| 2017/0164487 A1 | 6/2017 | Kim et al. |
| 2018/0310423 A1 | 10/2018 | Koo et al. |
| 2019/0268033 A1 | 8/2019 | Cha et al. |
| 2020/0267847 A1 | 8/2020 | Lee et al. |
| 2021/0218129 A1 | 7/2021 | Kim et al. |

FOREIGN PATENT DOCUMENTS

| | | |
|---|---|---|
| KR | 10-2015-0028112 A | 3/2015 |
| KR | 10-2016-0127542 A | 11/2016 |
| KR | 10-2017-0019973 A | 2/2017 |
| KR | 10-2017-0048043 A | 5/2017 |
| KR | 10-1783658 B1 | 10/2017 |
| KR | 10-2019-0133961 A | 12/2019 |
| KR | 10-2020-0101178 A | 8/2020 |
| KR | 10-2022-0036077 A | 3/2022 |
| WO | 2018/079869 A1 | 5/2018 |

\* cited by examiner

ELECTRONIC DEVICE INCLUDING A CONDUCTIVE PORTION AND CONTACT MEMBER MAKING CONTACT WITH SUBSTRATE

CLAIM OF PRIORITY

This application is a continuation application, claiming priority under § 365(c), of an International application No. PCT/KR2022/010833, filed on Jul. 22, 2022, which is based on and claims the benefit of a Korean patent application number 10-2021-0097279, filed on Jul. 23, 2021, in the Korean Intellectual Property Office, the disclosure of which is incorporated by reference herein in its entirety.

BACKGROUND

1) Technical Field

Various embodiment of the disclosure relate to an electronic device including, for example, a structure for fixing a flexible printed circuit board (FPCB) to maintain stable contact with other component.

2) Description of Related Art

A single electronic device such as a mobile communication terminal may be equipped with various functions in recent years. For example, an electronic device can be used to make phone calls, play games, watch video, listen to music, make payments, manager your schedule, and function as an electronic wallet. Further, display panels are getting larger thus making conveniently watching videos, a more pleasing experience.

The size of displays presents a dilemma. On the one hand, it is convenient for the electronic device to be small, and have small dimensions in order for the user to easily carry the electronic device. However, the small dimensions of the electronic device can restrict the size of the display screen. A large display screen can lead to large dimensions of the electronic device, making it harder for the user to carry the electronic device.

However, making the display and electronic device foldable can allow the user to enjoy a large display screen by unfolding the electronic device. When the user is carrying the electronic device, the user can fold the electronic device, which can reduce the longest dimension by half.

Various electronic components may need to be arranged in a narrow space in order to provide a foldable electronic device.

If a PCB and/or the FPCBs (now collectively referred to as a PCB) are disposed inside the electronic device, it may be important to fix the PCB to prevent movement in the vertical direction. Movement in the vertical direction may cause poor contact between electronic components and/or damage to the devices due to interference.

Using a screw to fix the PCB may require a mounting area in a narrow space in the electronic device, thereby reducing space for arranging other electronic components.

SUMMARY

According to an embodiment, an electronic device comprises: a housing including a conductive portion and a non-conductive portion; a first substrate; at least one electronic component disposed on the first substrate; a second substrate electrically coupled to the first substrate, the second substrate including a first surface facing a first direction and a second surface facing a second direction; at least one contact member disposed between the first surface of the second substrate and the conductive portion of the housing; and a support member disposed between the first surface of the second substrate and the non-conductive portion of the housing.

According to an embodiment, an electronic device comprises: a housing including a plurality of conductive portions and a non-conductive portion; a first substrate; at least one electronic component disposed on the first substrate; a second substrate electrically coupled to the first substrate overlapping at least two of the plurality of conductive portions; a grip sensor disposed on the second substrate and configured to sense a user's grip of the electronic device; and a control circuit. The control circuit may be configured to couple at least two mutually insulated portions of the plurality of conductive portions to each other based on information from the grip sensor.

According to an embodiment, an electronic device comprises: a housing including a conductive portion and a non-conductive portion; a first substrate; at least one electronic component disposed on the first substrate; a second substrate including a surface facing a first direction and a second surface facing a second direction opposite to the first direction, the second substrate electrically coupled to the first substrate; at least one contact member disposed between the first surface of the second substrate and the conductive portion of the housing; and a support member disposed between the first surface of the second substrate and the non-conductive portion of the housing. At least a part of the second surface of the second substrate may face a stepped portion formed in the housing, and movement in the second direction of the second surface of the second substrate may be prevented by the stepped portion.

DETAILED DESCRIPTION

Therefore, various methods of improving spatial arrangement may be provided. According to an embodiment, a printed circuit board (PCB) and/or flexible printed circuit boards (FPCBs) with various components arranged thereon may be disposed at an appropriate position to effectively use a narrow space.

According to an embodiment of the disclosure, provided is an electronic device in which a PCB and/or FPCBs are fixed not to move in a height direction without using a fastening member such as a screw.

Moreover, a portion of the housing can be used as an antenna. According to an embodiment of the disclosure, an electronic device is provided that reduces performance degradation of an antenna, when a user grabs or touches the electronic device.

According to an embodiment, component breakage caused by a fastening structure may advantageously be reduced.

Figure 1:
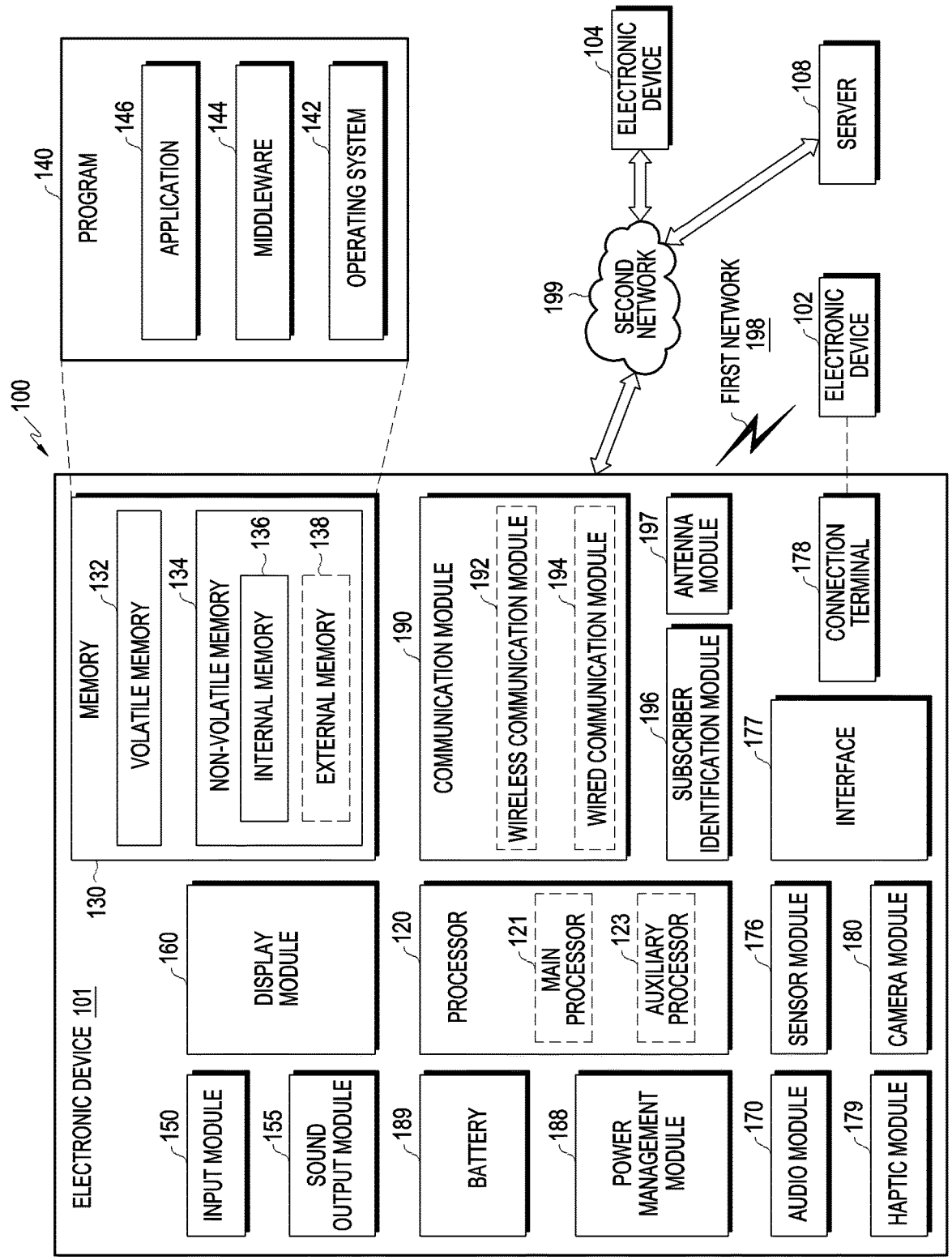
FIG. 1 is a block diagram illustrating an electronic device in a network environment according to an embodiment.
Figure 2:
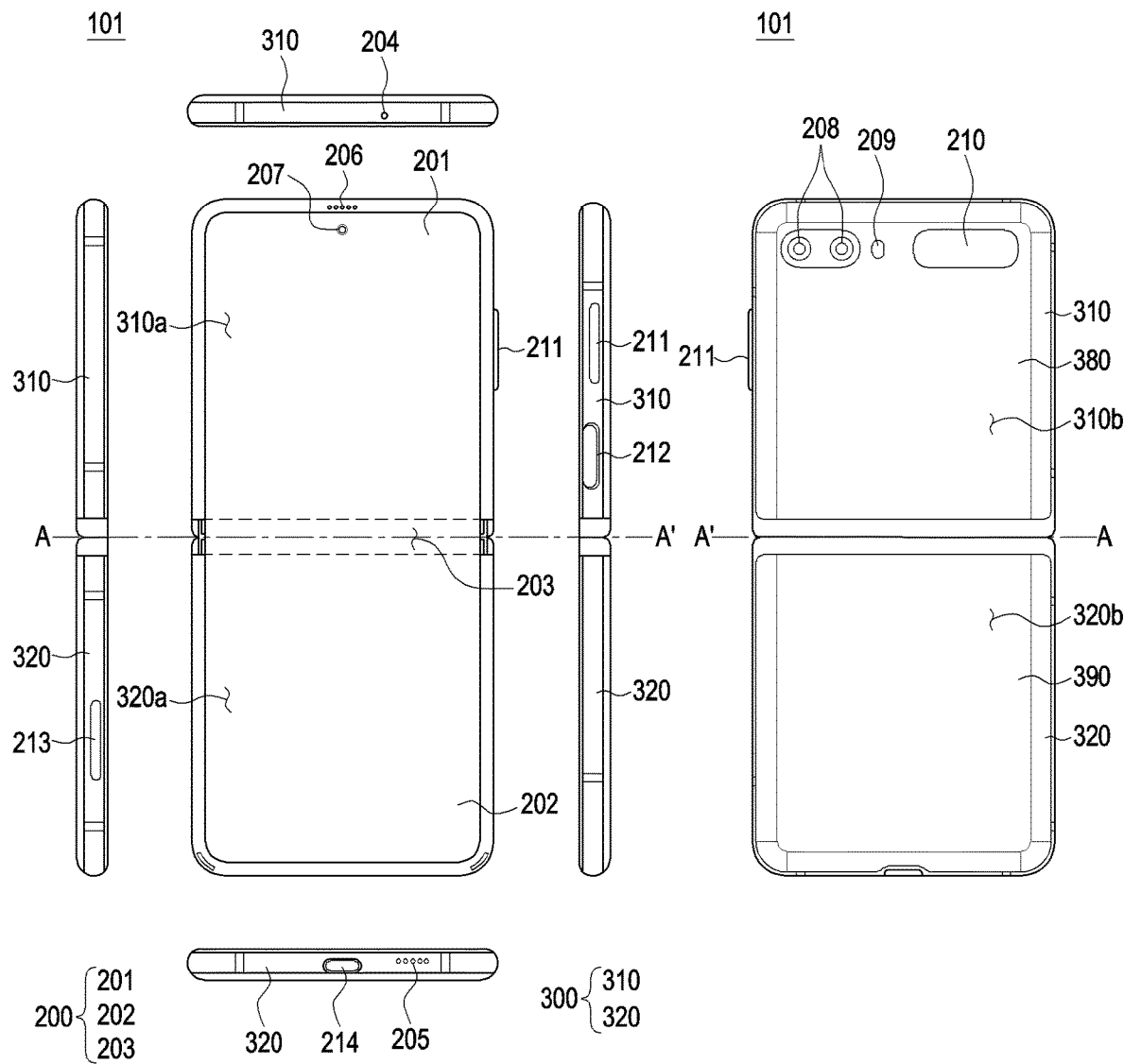
FIG. 2 is a diagram illustrating an electronic device in an unfolded state according to an embodiment of the disclosure.

FIG. 1 describes an electronic device 101, and FIG. 2 describes the housing of a foldable electronic device. FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The term "processor" shall be understood to refer to both the singular and plural contexts in this document.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a board (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The size of display module 160 presents a dilemma. On the one hand, it is convenient for the electronic device 101 to be small, and have small dimensions in order for the user to easily carry the electronic device 101. However, the small dimensions of the electronic device can restrict the size of the display module 160. A large display module 160 can lead to large dimensions of the electronic device 101, making it harder for the user to carry the electronic device. A foldable electronic device, such as shown in FIG. 2 allows the user to enjoy a large display screen when the electronic device is in the unfolded state. When the user is carrying the electronic device, the user can fold the electronic device, which reduces the vertical dimension by half.

FIG. 2 is a diagram illustrating an electronic device in an unfolded state according to an embodiment of the disclosure.

Referring to FIG. 2, the electronic device 101 (e.g., the electronic device 101 of FIG. 1) according to an embodiment may include a display 200 (e.g., the display device 160 of FIG. 1).

A surface on which the display 200 is disposed may be defined as the front surface of the electronic device 101. The front surface of the electronic device 101 may be formed by a front plate which is at least partially substantially transparent (e.g., a glass plate or polymer plate including various coating layers). A surface opposite to the front surface may be defined as the rear surface of the electronic device 101.

The rear surface of the electronic device 101 may be formed by a substantially opaque rear plate (hereinafter, referred to as a 'rear cover'). The rear cover may be formed of, for example, coated or tinted glass, ceramic, polymer, metal (e.g., aluminum, stainless steel (STS), or magnesium), or a combination of at least two of the above materials. A surface surrounding a space between the front surface and the rear surface may be defined as a side surface of the electronic device 101. The side surface may be coupled with the front plate and the rear cover and formed by a side bezel structure (or "side member") including metal and/or polymer. In some embodiments, the rear cover and the side bezel structure may be integrally formed and include the same material (e.g., a metallic material such as aluminum).

The electronic device 101 may include at least one of the display 200, audio modules 204, 205, and 206, a sensor module 209, camera modules 207 and 208, key input devices 211, 212, and 213, or a connector hole 214. In some embodiments, the electronic device 101 may not be provided with at least one (e.g., the key input devices 211, 212, and 213) of the components or additionally include other components (e.g., a light emitting element).

The audio modules 204, 205, and 206 may include a microphone hole 204 and speaker holes 205 and 206. A microphone for obtaining an external sound may be disposed in the microphone hole 204, and in some embodiments, a plurality of microphones may be disposed to detect the direction of a sound. The speaker holes 206 and 207 may include an external speaker hole 206 and a receiver hole 207 for calls. In some embodiments, the speaker holes 205 and 206 and the microphone hole 204 may be implemented as a single hole, or a speaker (e.g., a piezo speaker) may be included without the speaker holes 205 and 206. The positions and number of the microphone hole 204 and the speaker holes 205 and 206 may vary according to embodiments.

The camera modules 207 and 208 may include a first camera device 207 disposed on a front surface 310*a* of a first housing structure 310, and a rear camera device 208 disposed on a second surface 310*b* of the first housing structure 310 in the electronic device 101. The electronic device 101 may further include a flash (not shown). Each of the camera modules 207 and 208 may include one or more lenses, an image sensor, and/or an image signal processor. The flash (not shown) may include, for example, a light emitting diode (LED) or a xenon lamp.

The sensor module 209 may generate an electrical signal or data value corresponding to an internal operation state or external environmental state of the electronic device 101. While not shown, the electronic device 101 may include other sensor modules additionally or alternatively to the sensor module 209 provided on the second surface 310*b* of the first housing structure 310. The electronic device 101 may include, as the sensor module, at least one of, for example, a proximity sensor, a fingerprint sensor, a heart rate monitor (HRM) sensor, a gesture sensor, a gyro sensor, a barometric pressure sensor, a magnetic sensor, an acceleration sensor, a grip sensor, a color sensor, an IR sensor, a biometric sensor, a temperature sensor, a humidity sensor, or an illuminance sensor.

The key input devices 211, 212, and 213 may be arranged on the side surface of a housing 300. In another embodiment, the electronic device 101 may not include some or any of the above key input devices 211, 212, and 213, and a key input device which is not included may be implemented in another form such as a soft key on the display 200. In some embodiments, a key input device may be configured to implement a key input by the sensor module.

The connector hole 214 may be configured to accommodate a connector (e.g., a universal serial bus (USB) connector) for transmitting and receiving power and/or data to and from an external electronic device, and additionally or alternatively, a connector for transmitting and receiving an audio signal to and from an external electronic device.

The housing 300 may include the first housing structure 310, a second housing structure 320, a first rear cover 380, a second rear cover 390, and a hinge structure (not shown). A 'housing structure' may be a combination and/or combined configuration of various components, including a housing. The housing 300 of the electronic device 101 may be implemented in a different shape or with a different combination and/or combined configuration of components. In another embodiment, for example, the first housing structure 310 and the first rear cover 380 may be integrally formed, and the second housing structure 320 and the second rear cover 390 may be integrally formed.

Although the housing 300 is shown in FIG. 2 as having the outward appearance of a foldable electronic device, the disclosure is not limited thereto. For example, the housing 300 may have the outward appearance of a bar type or a plate type, or at least a part of the display 200 may form the exterior of a rollable electronic device which may be wound or rolled.

The first housing structure 310 may be coupled to the hinge structure (not shown) and include the first surface 310*a* facing a first direction and the second surface 310*b* facing a second direction opposite to the first direction. The second housing structure 320 may be coupled to the hinge structure (not shown), include a third surface 320*a* facing a third direction and a fourth surface 320*b* facing a fourth direction opposite to the third direction, and rotate around the hinge structure (or a folding axis A-A') with respect to the first housing structure 310. In this case, rotation operations of the second housing structure 320 with respect to the first housing structure 310 may include an in-folding operation in which the first surface 310*a* and the third surface 320*a* face each other and an out-folding operation in which the second surface 310*b* and the fourth surface 320*b* face each other.

The first housing structure 310 and the second housing structure 320 may be disposed on both sides of the folding axis A-A' (or above and below the folding axis A-A'), and symmetrical in shape as a whole with respect to the folding axis A-A'. The angle or distance between the first housing structure 310 and the second housing structure 320 may be different depending on whether the electronic device 101 is in an unfolded state, a folded state, or a partially unfolded (or partially folded) intermediate state. According to an embodiment, although the first housing structure 310 additionally includes various sensors unlike the second housing structure 320, the first housing structure 310 and the second housing structure 320 may have a mutually symmetrical shape in the other area.

The display 200 may be a flexible display. For example, the display 200 may be a display in which at least a partial area is deformable into a flat surface or a curved surface. According to an embodiment, the display 200 may include a folding area 203, a first area 201 disposed on one side of the folding area 203 (e.g., above the folding area 203 illustrated in FIG. 2), and a second area 202 disposed on the other side of the folding area 203 (e.g., below the folding area 203 illustrated in FIG. 2). However, the area division of the display 200 illustrated in FIG. 2 is exemplary, and the display 200 may be divided into a plurality of areas (e.g., two areas or four or more areas) according to its structure or function. For example, while the area of the display 200 may be divided by the folding area 203 or the folding axis A-A' in the embodiment shown in FIG. 2, the area of the display 200 may be divided with respect to another folding area or another folding axis (e.g., a folding axis perpendicular to the folding axis A-A') in another embodiment.

The first rear cover 380 may be disposed on one side of the folding axis A-A' on the rear surface of the electronic device 101 and have, for example, a substantially rectangular periphery. The periphery of the first rear cover 380 may be surrounded by the first housing structure 310. Similarly, the second rear cover 390 may be disposed on the other side of the folding axis A-A' on the rear surface of the electronic device 101, and have a periphery surrounded by the second housing structure 320. According to an embodiment, the first rear cover 380 and the second rear cover 390 may be substantially symmetrical in shape with respect to the folding axis A-A'. However, the first rear cover 380 and the second rear cover 390 do not necessarily have symmetrical shapes. In another embodiment, the electronic device 101 may include the first rear cover 380 and the second rear cover 390 in various shapes. In another embodiment, the first rear cover 380 may be integrally formed with the first housing structure 310, and the second rear cover 390 may be integrally formed with the second housing structure 320.

The first rear cover 380, the second rear cover 390, the first housing structure 310, and the second housing structure 320 may form a space in which various components (e.g., a printed circuit board (PCB) or a battery) of the electronic device 101 may be arranged. According to an embodiment, one or more components may be disposed or visually exposed on the rear surface of the electronic device 101. For example, at least a part of a sub-display 210 may be visually exposed through the first rear cover 380. The position and size of the sub-display 210 are not limited to the illustrated embodiment. In another embodiment, one or more components or sensors may be visually exposed through the first rear cover 380. In an embodiment, the sensors may include a proximity sensor and/or a rear camera. In addition, while not shown separately in the drawings, one or more components or sensors may be visually exposed through the second rear cover 390. According to an embodiment, the front camera 207 exposed on the front surface of the electronic device 101 or the rear camera 208 exposed through the first rear cover 380 may include one or more lenses, an image sensor, and/or an image signal processor. The flash (not shown) may include, for example, a light emitting diode (LED) or a xenon lamp. In some embodiments, two or more lenses (an IR camera, a wide angle lens, and a telephoto lens) and image sensors may be disposed on one side of the electronic device 101.

At least a part of the housing 300 (e.g., the first housing structure 310 and the second housing structure 320) may be formed of a metallic or non-metallic material having a specified rigidity to support the display 200. The at least part formed of the metal material may provide a ground plane for the electronic device 101, and may be electrically coupled to a ground line formed on a PCB (illustrated in FIG. 3 described later).

Various electronic components may need to be arranged in a narrow space in order to provide a foldable electronic device. If a PCB and/or the FPCBs (now collectively referred to as a PCB) are disposed inside the electronic device, it may be important to fix the PCB to prevent movement in the vertical direction. Movement in the vertical direction may cause poor contact between electronic components and/or damaging the devices due to interference.

Using a screw to fix the PCB may require a mounting area in a narrow space in the electronic device, thereby reducing space for arranging other electronic components.

Figure 3:
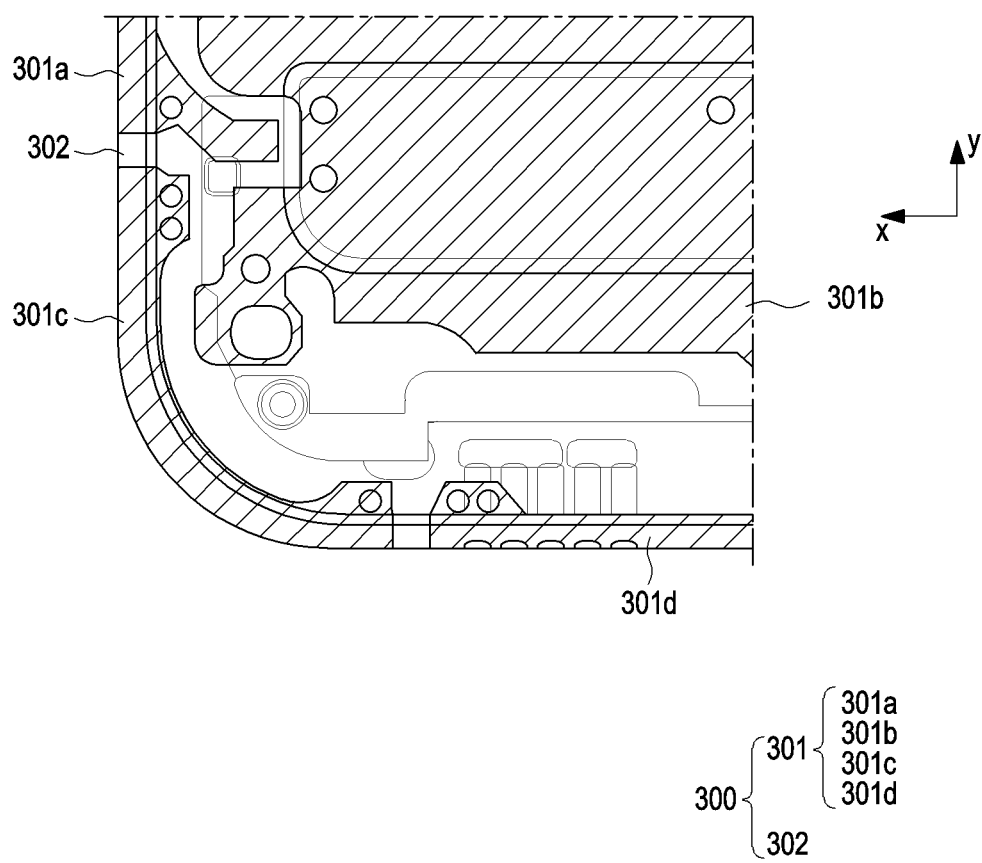
FIG. 3 is a diagram illustrating a housing of an electronic device according to an embodiment of the disclosure.

FIG. 3 is a diagram illustrating the housing 300 of the electronic device 101 according to an embodiment of the disclosure which can affix the PCB without a screw.

FIG. 3 and the other drawings illustrate a spatial coordinate system defined by an X axis, a Y axis, and a Z axis orthogonal to one another. The X axis may represent the width direction of the electronic device 101, the Y axis may represent the length direction of the electronic device 101, and the Z axis (refer to FIG. 6) may represent the height (or thickness) direction of the electronic device 101. In the following description, a 'first direction' may mean a direction parallel to the Z axis, a 'second direction' may mean a direction opposite to the Z axis, and a 'third direction' may mean a direction parallel to the X axis.

The term "parallel" may be understood to mean substantially parallel, or within 3 degrees deviation of parallel. The term perpendicular shall be understood to mean substantially perpendicular or within 3 degrees deviation of perpendicular.

Referring to FIG. 3, an electronic device 101 (e.g., the electronic device 101 of FIGS. 1 and 2) may include a housing 300 (e.g., the housing 300 of FIG. 2). The housing 300 may include a conductive portion 301 and a non-conductive portion 302. The conductive portion 301 may be formed to include, for example, a metallic material (e.g., aluminum, stainless steel (STS), or magnesium). At least a part (e.g., the conductive portion 301) of the housing 300 may include a metal frame (or metal bezel) structure to increase the mechanical rigidity of the electronic device 300. At least another part (e.g., the non-conductive portion 302) of the housing 300 may include a dielectric structure (e.g., an extrudate or polymer structure). In the case where the at least one part of the housing 300 includes the metal frame structure, when a radio signal (or communication signal) (e.g., radio frequency (RF) signal) is radiated from an antenna element disposed inside the electronic device 101, the radio signal may propagate along the surface of the metal frame of the housing 300, thereby affecting antenna performance.

The conductive portion 301 of the housing 300 may include a first conductive portion 301a, a second conductive portion 301b, a third conductive portion 301c, and a fourth conductive portion 301d. The first conductive portion 301a, the second conductive portion 301b, the third conductive portion 301c, and the fourth conductive portion 301d may be disconnected and insulated from one another by the non-conductive portion 302.

At least one of the conductive portions 301a-301d may form the exterior of the housing 300. A radio signal propagates along the conductive portions. Accordingly, the conductive portions may be used as antenna radiators. Further, the second conductive portion 301b located inside the housing 300 may also be used as a propagation path of a radio signal. The antenna performance may be improved by coupling the second conductive portion 301b to another conductive portion.

According to an embodiment, the performance degradation is reduced when the user's hand makes contact with the conductive portions 301a-301d of the housing.

Figure 4:
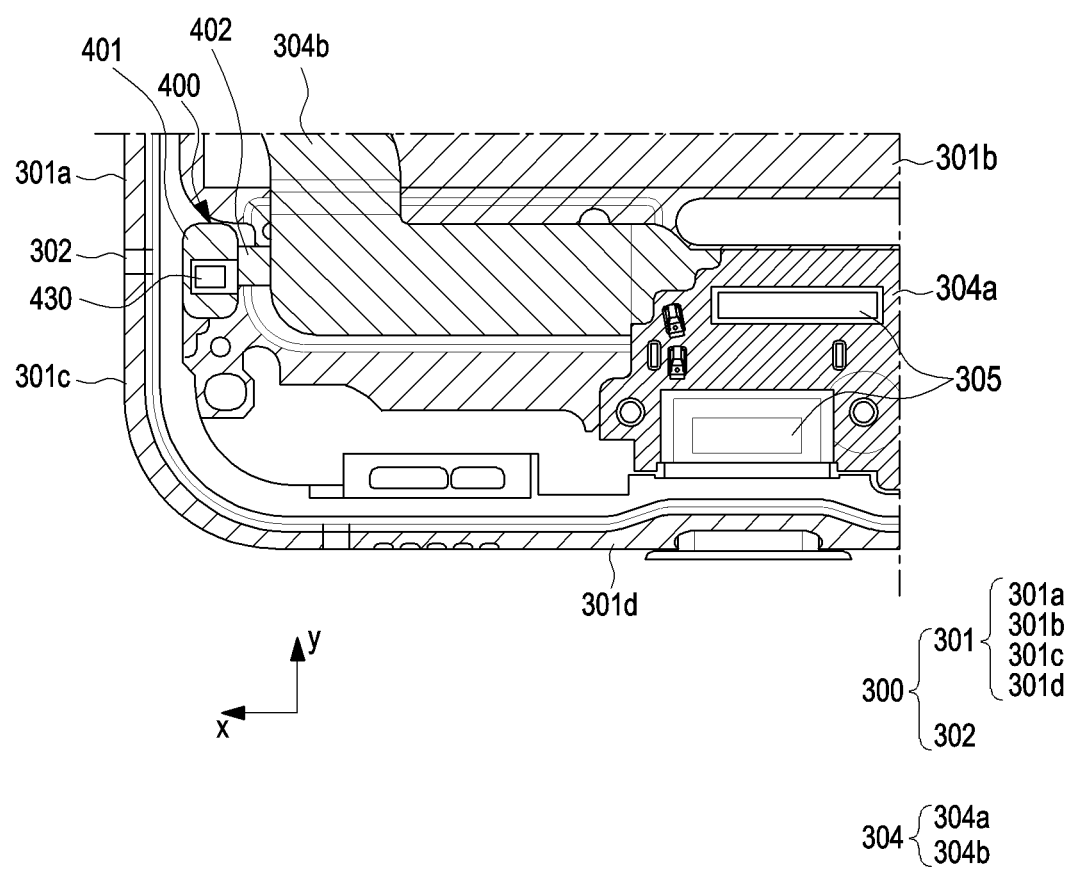
FIG. 4 is a diagram illustrating the electronic device in which various electronic components and a board are additionally arranged in the embodiment of FIG. 3.
Figure 5:
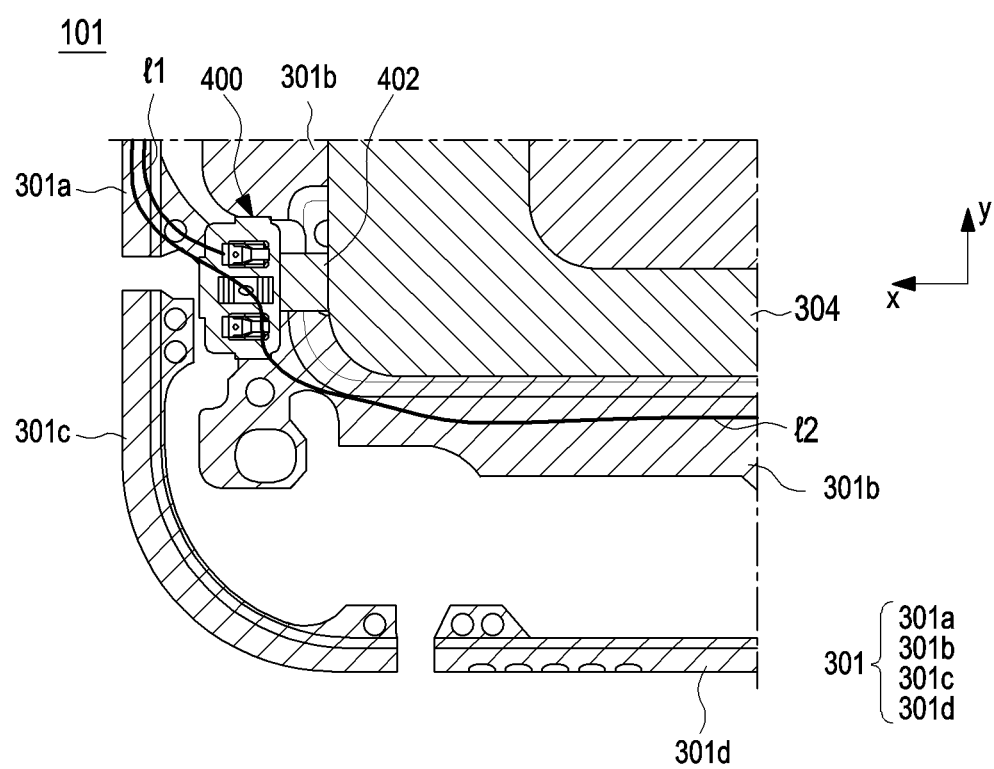
FIG. 5 is a diagram illustrating different signal transmission paths formed based on information about a user's grip obtained through a grip sensor in the embodiment of FIG. 4.

FIG. 4 is a diagram of an electronic device in which various electronic components and boards are additionally disposed in the embodiment of FIG. 3. FIG. 5 is a diagram illustrating different signal transmission paths formed based on information about a user's grip obtained through a grip sensor in the embodiment of FIG. 4.

Various electronic component(s) and board(s) may be disposed in the electronic device 101. For example, the various electronic components may include the processor 120, the memory 130, the sound output module 155, the sensor module 176, the interface 177, and the battery 189 described above with reference to FIG. 1. In addition, the various electronic component(s) that may be arranged in the electronic device 101 may further include other components mentioned in FIG. 1 or other components not mentioned in FIG. 1. According to another example, the various board(s) may include a printed circuit board (PCB) and a flexible printed circuit board (FPCB), and the numbers of PCBs and FPCBs may also vary according to embodiments. It shall be understood that a FPCB is a type of PCB. Accordingly, the term PCB shall be understood to include FPCB, unless the context clearly indicates otherwise.

Referring to FIG. 4, the electronic device 101 may include various electronic components 305, and a first substrate 304 and a second substrate 400. The electronic components 305 can be disposed on the first substrate 304 and the second substrate 400. The substrates 304, 400 provide an area to arrange the electronic components 305, thereon.

The first substrate 304, which is a board on which various electronic components 305 including a processor are arranged, may be referred to as a main board included in the electronic device 101. The processor disposed on the first substrate 304 may include at least one of, for example, a central processing unit (CPU), an application processor (AP), a graphic processing unit (GPU), an image signal processor of a camera, or a baseband processor (or a communication processor (CP)). The processor may be implemented as a system on chip (SoC) or a system in package (SiP). That is, the various electronic components 305 may be mounted as an integrated circuit (IC) chip on the first substrate 304.

The first substrate 304 may be formed to be one board or a combination of two or more boards. For example, a first PCB 304a and a second PCB 304b are shown in FIG. 4. Various components such as the processor may be arranged on the first PCB 304a. The second PCB 304b may provide electrical connection to another board (e.g., the second substrate 400 or another board not shown in the drawing). The second PCB 304b may include or be coupled to, for example, an interposer, a board to board connector, or an FPCB.

The second substrate 400 may be electrically coupled to the first substrate 304, and may electrically couple at least one of a plurality of conductive portions included in the housing 300 and the first substrate 304. or The second substrate 400 may electrically couple two different conductive portions among the plurality of conductive portions. The second substrate 400 may be referred to as a 'sub board' to distinguish it from the first substrate 304 on which various electronic components are arranged.

The second substrate 400 may be provided to electrically couple the first conductive portion 301a and the second conductive portion 301b illustrated in FIG. 3. The second substrate 400 may be formed so that at least one part of the second substrate 400 overlaps with the first conductive portion 301a, and at least another part of the second substrate 400 overlaps the second conductive portion 301b.

However, this is merely an example and is not necessarily limited thereto. The second substrate 400 may electrically couple the first conductive portion 301a and the third conductive portion 301c, electrically couple the first conductive portion 301a and the fourth conductive portion 301d, or electrically couple the first conductive portion 301a and the first substrate 304. The second substrate 400 may be provided for electrical connection between the conductive portions 301b, 301c, and 301d (other than the first conductive portion 301a) and other components. As described above, the use and arrangement position of the second substrate 400 may vary according to embodiments. In the following description, an embodiment in which the second substrate 400 electrically couples the first conductive portion 301a and the second conductive portion 301b is disclosed, it should be noted that the disclosure is not limited to the embodiment.

The second substrate 400 may include a base 401 coupled to the first substrate 304 through a connection member 402. For example, the second substrate 400 may include the base 401 which is coupled to the first substrate 304 and on which a bent portion (e.g., the connection member 402) and at least one component (e.g., a C-clip, a support member, a switching element and/or a sensor) are disposed. The second substrate 400 may include an FPCB. A switching element for coupling the first conductive portion 301a to the second conductive portion 301b may be disposed on one surface of the base 401. 'Switching' may mean a change in a movement path of an electrical signal.

The second substrate 400 may further include a grip sensor 430 as an example of the switching element. The switching element may be integrated with the grip sensor 430 as an electrical component, such as a chip. For example, the grip sensor 430 may include a sensor for measuring and/or obtaining the position of the user's hand and a control circuit for controlling (e.g., switching) the flow of an electrical signal, based on the position of the user's hand.

The sensor measuring and/or obtaining the position of the user's hand may include, but is not limited to a capacitive sensor, an inductive sensor, a resistive sensor, a tactile sensor, and a heat sensor.

The control circuit may be a component included in the processor 120 described before with reference to FIG. 1, or a component provided separately from the processor 120. An example of a change in a movement path of an electrical signal, caused by the grip sensor will be described with reference to FIG. 5.

Antenna performance degradation caused by the user's hand grip of the electronic device 101 may be reduced by using the second substrate 400 and the grip sensor 430 as a switching element disposed on the second substrate 400. For example, it may be assumed that a propagation path of a radio signal is formed by using the first conductive portion 301a. In this case, the grip sensor 430 may recognize the position of the user's hand (or the presence or absence of the user's grip). When the user does not hold the electronic device 101 with his/her hand, the propagation path may not be changed. In contrast, when the user holds the electronic device 101 with his/her hand, the propagation path may be changed to reduce the antenna performance degradation.

Referring to FIG. 5, a propagation path when the user is not holding the electronic device 101 is l1, and the propagation path may be cut off at second substrate 400. When the user holds the electronic device 101 with the hand, a propagation path l2 may be formed to extend and make longer the propagation path l1. That is, the electronic device 101 of the disclosure may identify whether the user is holding the electronic device 101 by using the grip sensor 430, and when needed, change the propagation path of a radio signal. The foregoing reduces the antenna performance degradation caused when the user wraps the electronic device 101 with the hand.

FIG. 4 illustrates the grip sensor 430 on one surface of the second substrate 400, and FIG. 5 illustrates clips disposed on one surface of the second substrate 400. With reference to FIGS. 6 to 10, the second substrate 400 according to an embodiment of the disclosure will be described below in detail.

Figure 6:
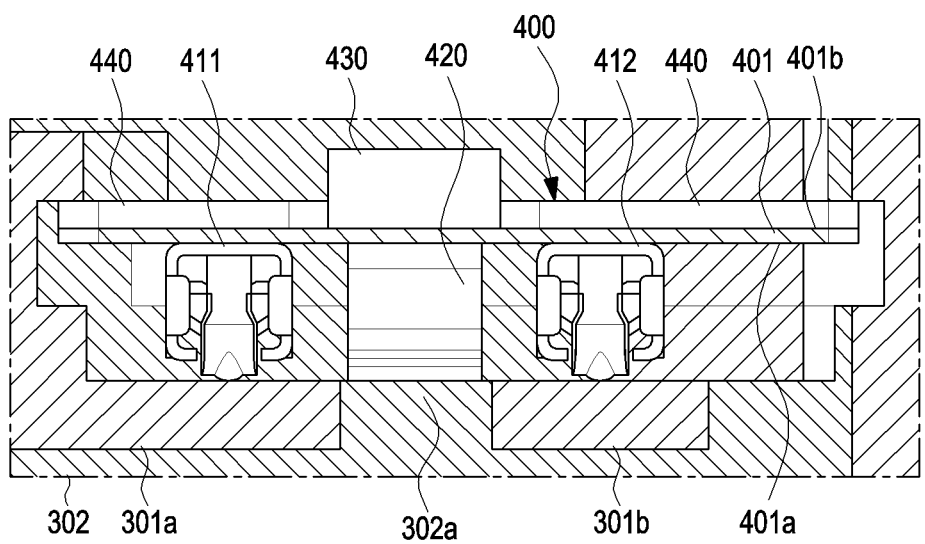
FIG. 6 is a cross-sectional view illustrating a second substrate according to an embodiment of the disclosure.
Figure 7:
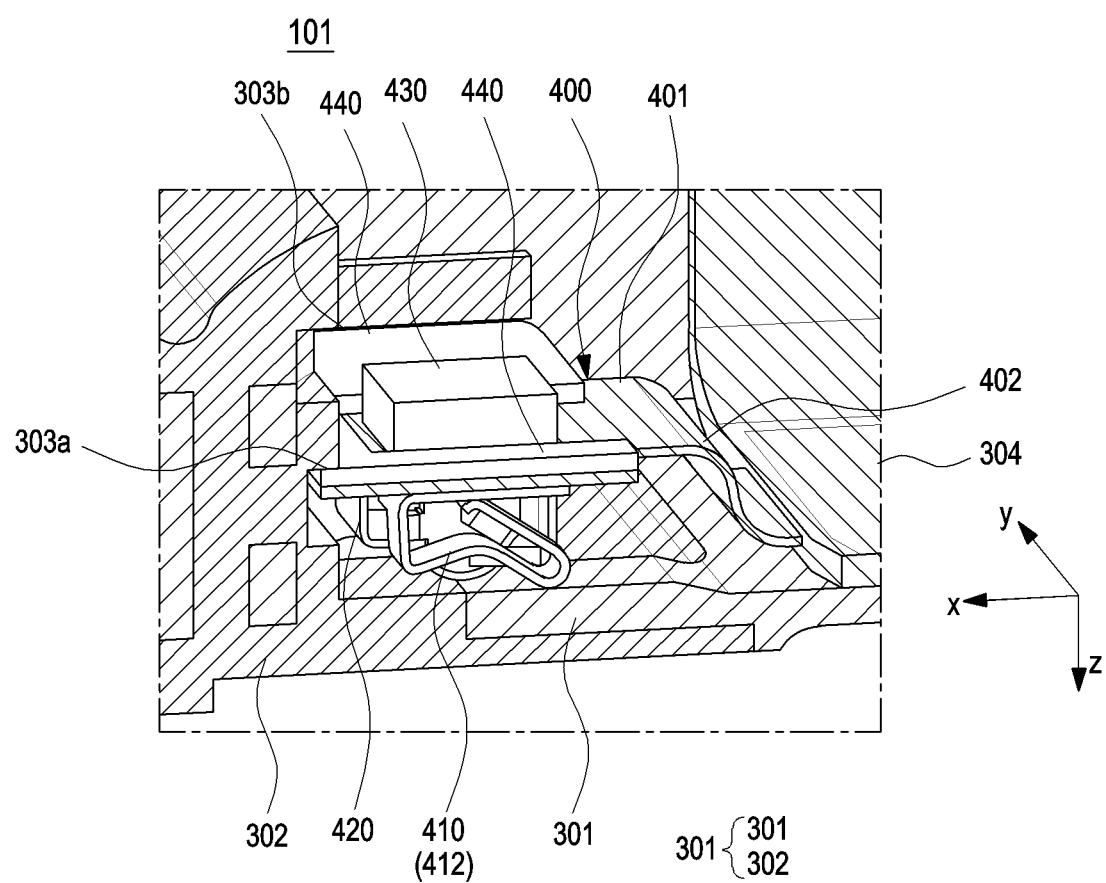
FIG. 7 is a perspective view illustrating a second substrate viewed from one direction according to an embodiment of the disclosure.
Figure 8:
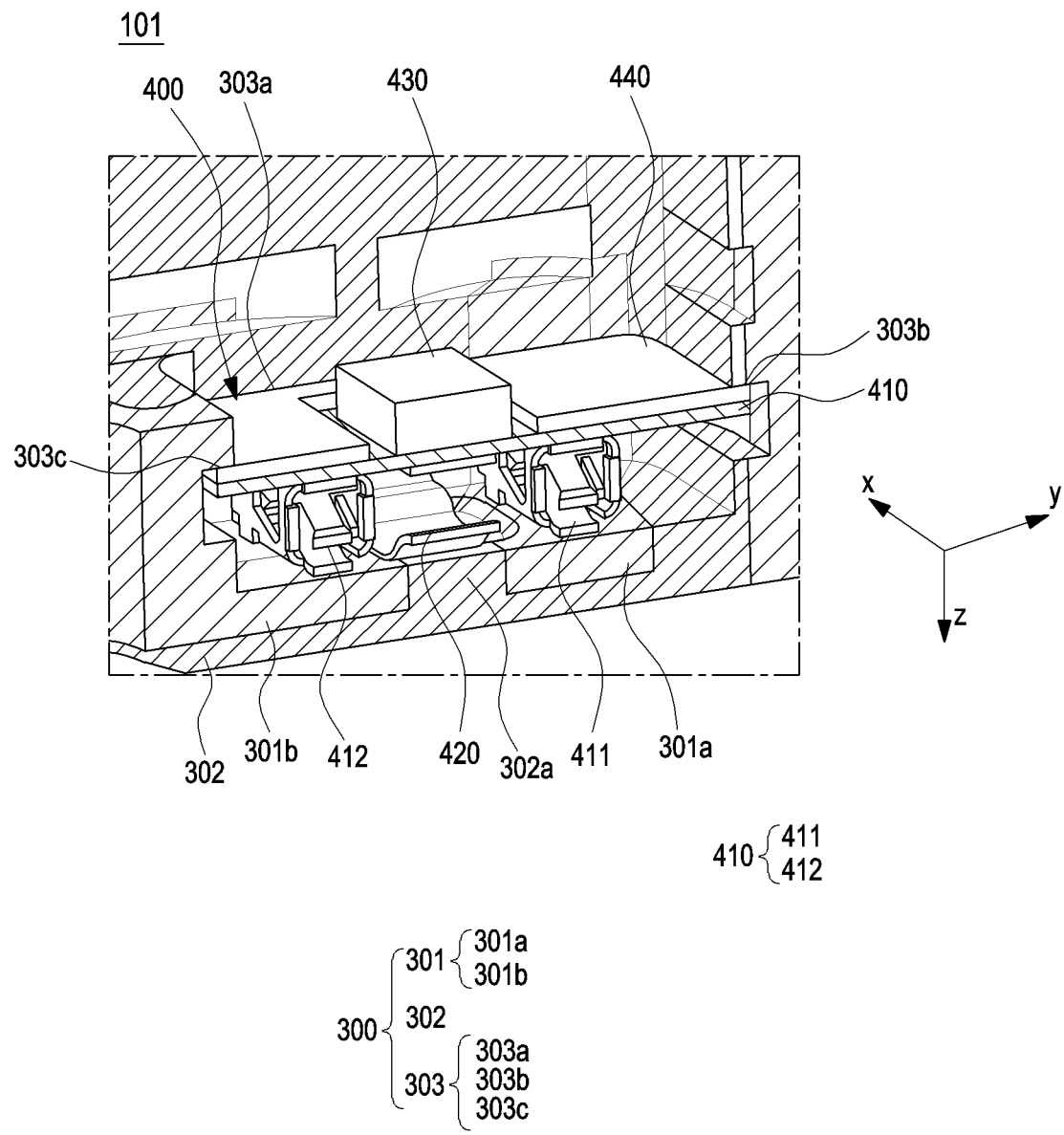
FIG. 8 is a perspective view illustrating a second substrate viewed from another direction according to an embodiment of the disclosure.

FIG. 6 is a cross-sectional view illustrating the second substrate 400 according to an embodiment of the disclosure. FIG. 7 is a perspective view illustrating the second substrate 400 viewed from one direction according to an embodiment of the disclosure. FIG. 8 is a perspective view illustrating the second substrate 400 viewed from another direction according to an embodiment of the disclosure. FIGS. 6, 7 and 8 may illustrate the second substrate 400 mounted and fixed in the housing 300 of the electronic device 101. A description of components already described in the foregoing embodiment will be avoided herein.

The second substrate 400 may be fixedly disposed at a specific position inside the housing 300. According to an embodiment of the disclosure, the second substrate 400 may be formed to be assembled and disassembled, and a fixing structure that restrains the second substrate 400 from moving in a height direction during assembly of the second substrate 400. Unless the second substrate 400 is restrained, interference between devices during the assembly process of the housing may lead to breakage of components. In this regard, according to the disclosure, an embodiment for assembling and restraining the second substrate 400 in a narrow space may be provided.

Referring to FIGS. 6, 7 and 8 together, the second substrate 400 may include a first surface 401a facing a first direction (e.g., a Z-axis direction) and a second surface 401b facing a direction opposite to the first direction. When the second substrate 400 is mounted on the housing 300, the first surface 401a may face the conductive portions 301a, 301b, and a non-conductive portion 302a of the housing 300.

The electronic device 101 may include at least one contact member 410. The at least one contact member 410 is disposed between the first surface 401a of the second substrate 400 and the conductive portions 301a and 301b of the housing 300. The electronic device 101 can also include a support member 420. The support member 420 is disposed between the first surface 401a of the second substrate 400 and the non-conductive portion 302a of the housing 300.

When the at least one contact member 410 and the support member 420 are disposed on the first surface 401a of the second substrate 400, the second substrate 400 may be assembled in the inner space of the housing 300. The second substrate 400 may be assembled in the inner space of the housing such that the at least one contact member 410 corresponds to the conductive portions 301a and 301b, and the support member 420 corresponds to the non-conductive portion 302a.

The contact member 410 may be formed of a C-clip. The contact member 410 formed of a C-clip may have a structure which may be elastically compressed in one direction, and restored to its original state when a pressing force is released. With a part of the contact member 410 fixed on the first surface 401a of the second substrate, another part of the contact member 410 may be pressed by the conductive portions 301a and 301b, thereby compressing the contact member 410. In this case, the other part of the contact member 410 may be compressed and move toward the first surface 401a of the second substrate 400. The support member 420 may be formed by processing a metal plate spring into the shape of 'D'. The support member 420 may also be elastically compressed when pressed in one direction, and restored to its original state when a the pressing force is released.

The support member 420 may not be a metallic member but have an injection-type bracket structure in which a part of the support member 420 is formed in the shape of 'D'. The injection-type bracket structure may be described later with reference to other drawings (e.g., FIGS. 23 and 24 to be described later). The support member 420 may be disposed in parallel with the contact member 410 in a third direction (e.g., an X-axis direction) perpendicular to the first direction and the second direction.

The electronic device 101 may further include the grip sensor 430 on one surface (e.g., the second surface 401b) of the board 400. The grip sensor 430 may include the sensor for measuring and obtaining the position of the user's hand, and the control circuit for controlling (e.g., switching) the flow of an electrical signal based on the position of the user's hand. The sensor and the control circuit may be integrated as one component (chip). The control circuit may be configured to couple at least two of a plurality of insulated portions of the conductive portion based on information about the user's grip, obtained from the grip sensor.

The second surface 401b of the electronic device 101 may further include a reinforcing member 440. The reinforcing member 440 may be provided to increase the mechanical rigidity of the second substrate 400. In this embodiment, on the assumption that the second substrate 400 is formed as an FPCB, the reinforcing member 440 may further be included to reinforce the rigidity of the FPCB. However, when the second substrate 400 is formed as a PCB, the reinforcement member 440 may be omitted.

The contact member 410 may include a first contact member 411 and a second contact member 412 disposed in parallel with the first contact member. The first contact member 411 and the second contact member 412 may be disposed at positions corresponding to the first conductive portion 301a and the second conductive portion 301b, respectively. The first contact member 411 and the second contact member 4120 may be disposed in parallel in the third direction (e.g., the X-axis direction). Further, the support member 420 may be disposed between the first contact member 411 and the second contact member 412, and disposed at a position corresponding to the non-conductive portion 302a.

Referring to FIGS. 7 and 8, the second substrate 400 may be mounted by sliding in the X-axis direction. In a reassembly or disassembly process, the second substrate 400 may be removed in a direction opposite to the X-axis direction.

A stepped portion 303 may be formed on an inner wall of the housing 300. The stepped portion 303 may be a hook structure formed by inserting a part of the conductive portion 301 and/or the non-conductive portion 302 of the housing 300 inward. The stepped portion 303 may be formed by processing the inner wall of the housing 300 through a t-cut process. At least a part of the second substrate 400 may be formed to contact the stepped portion 303, facing the stepped portion, during the assembly of the second substrate. After the second substrate 400 is assembled, the second substrate 400 may be restrained by the stepped portion 303 not to move.

The part of the second substrate 400 facing the stepped portion 303 may be the second surface 401b of the second substrate 400. The reinforcement member 440 formed to directly contact the stepped portion 303 may be disposed on the second surface 401b of the second substrate 400.

To restrain and fix the second substrate 400 to the housing 300, at least one part of the second substrate 400 may face the stepped portion 303 and be restrained or fixed. For example, the second substrate 400 may be formed to be restrained or fixed, while facing the stepped portion 303 at three different parts of the second substrate 400. Referring back to FIGS. 7 and 8, the stepped portion 303 may include a first stepped portion 303a, a second stepped portion 303b, and a third stepped portion 303c. When the second substrate 400 is mounted, three different parts of the second surface 401b may face the first stepped portion 303a, the second stepped portion 303b, and the third stepped portion 303c.

Figure 9:
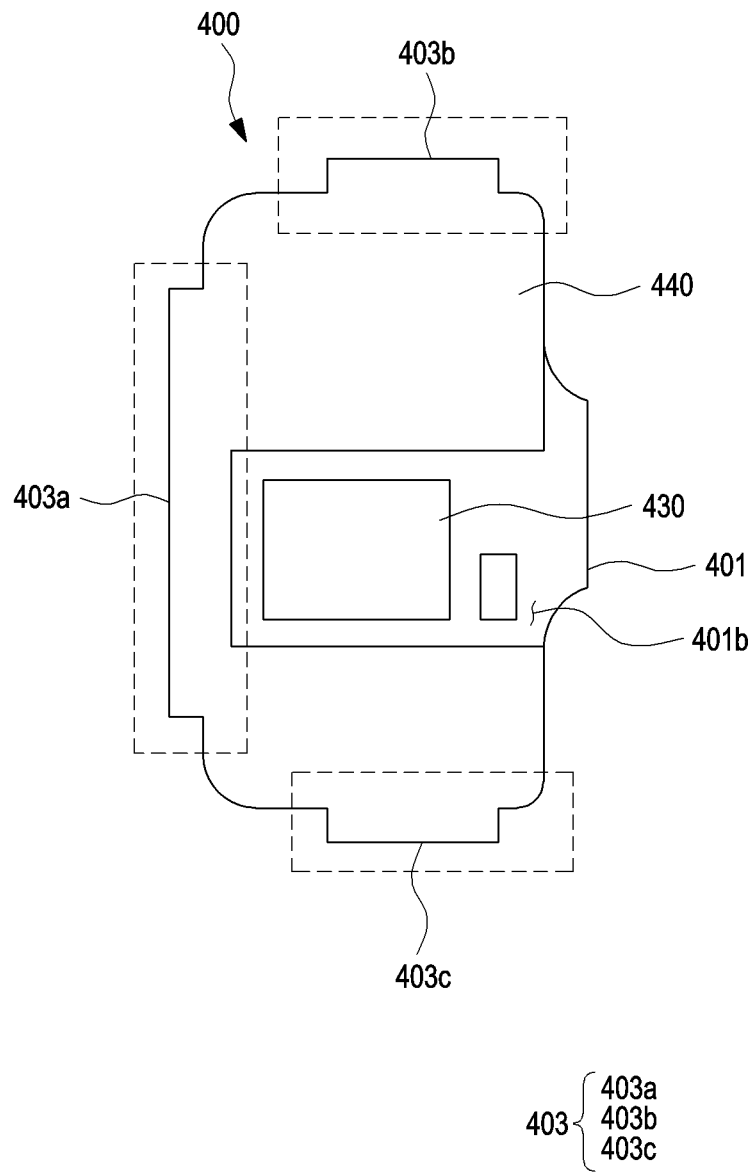
FIG. 9 is a diagram illustrating a second surface of a second substrate viewed from above according to an embodiment.
Figure 10:
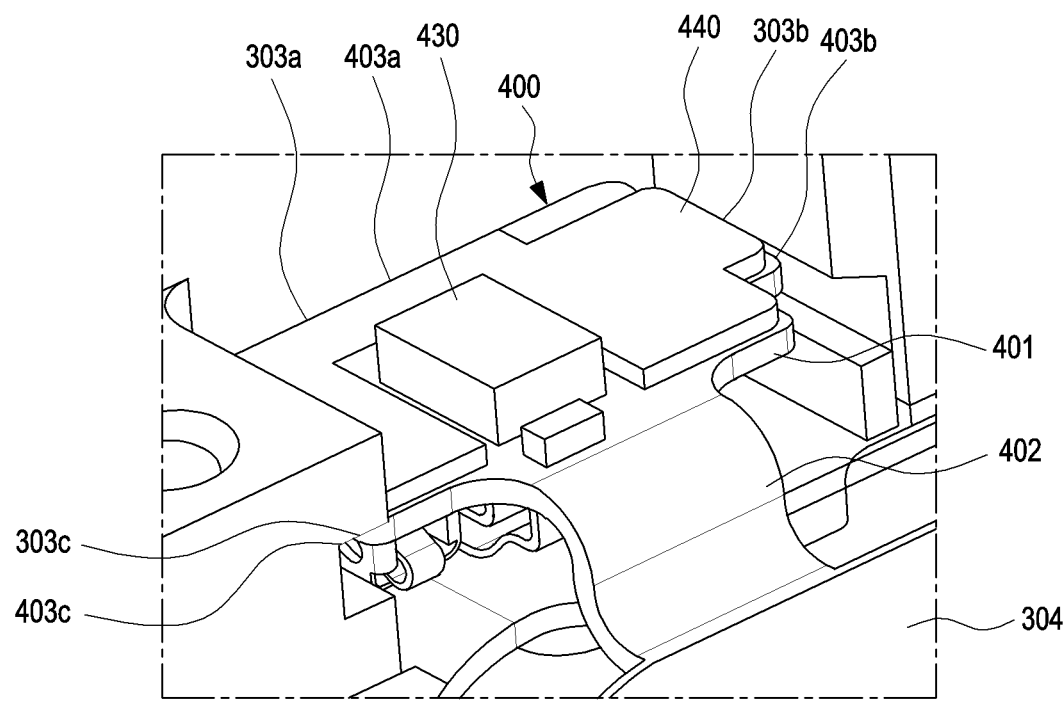
FIG. 10 is a diagram illustrating a flange of a second substrate facing a stepped portion according to an embodiment.

FIG. 9 is a diagram illustrating the second surface 401b of the second substrate 400 viewed from above according to an embodiment. FIG. 10 is a diagram illustrating a flange 403 of the second substrate 400, which faces the stepped portion 303 according to an embodiment.

The second substrate 400 may include at least one flange 403. For example, when the stepped portion 303 of the housing (e.g., the housing 300 of FIG. 6) includes the first stepped portion 303a, the second stepped portion 303b, and the third stepped portion 303c, the second substrate 400 may include a first flange 403a, a second flange 403b, and a third flange 403c facing the first stepped portion 303a, the second stepped portion 303b, and the third stepped portion 303c, respectively.

The first flange 403a, the second flange 403b, and the third flange 403c may be parts protruding from the base 401 to a predetermined length along the X axis, the Y axis, and an opposite direction to the Y axis in FIGS. 7 and 8. The first flange 403a, the second flange 403b, and the third flange 403c may be formed to be inserted to a predetermined length in t-cut areas formed for forming the first stepped portion 303a, the second stepped portion 303b, and the third stepped portion 303c in the housing.

According to an embodiment, only when the rigidity of the second substrate 400 is sufficient, the position of the second substrate 400 may be fixed after the assembly in the t-cut areas of the housing. For example, when the second substrate 400 is soft and thus wobbly, the second substrate 400 may be bent in a direction in which the contact member 410 is pushing and then deviated from the position to be fixed, without being kept in shape after the assembly in the housing. To prevent this, the reinforcement member 440 may be provided on one surface (e.g., the second surface 401b) of the second substrate 400. According to an embodiment, the reinforcement member 440 may be shape to cover end areas of the base 401 including the first flange 403a, the second flange 403b, and the third flange 403c. According to an embodiment, the reinforcement member 440 may be formed to cover approximately the entire area of the second surface 401b of the second substrate 400 except for an area in which a component (e.g., the grip sensor 430) is disposed on the second substrate in order to prevent the second substrate 400 from wobbling.

The first flange 403a may be restrained or fixed by the first stepped portion 303a from moving in at least one of the three directions (e.g., a direction opposite to the Z axis, the Y-axis direction, and the X-axis direction in FIGS. 7 and 8). The second flange 403b may be restrained or fixed by the second stepped portion 303b from moving in at least one of the three directions (e.g., the direction opposite to the Z axis, the Y-axis direction, and the X-axis direction in FIGS. 7 and 8). The third flange 403c may be restrained or fixed by the third stepped portion 303c from moving in at least one of the three directions (e.g., the direction opposite to the Z axis, a direction opposite to the Y axis, and the X-axis direction in FIGS. 7 and 8).

Figure 11:
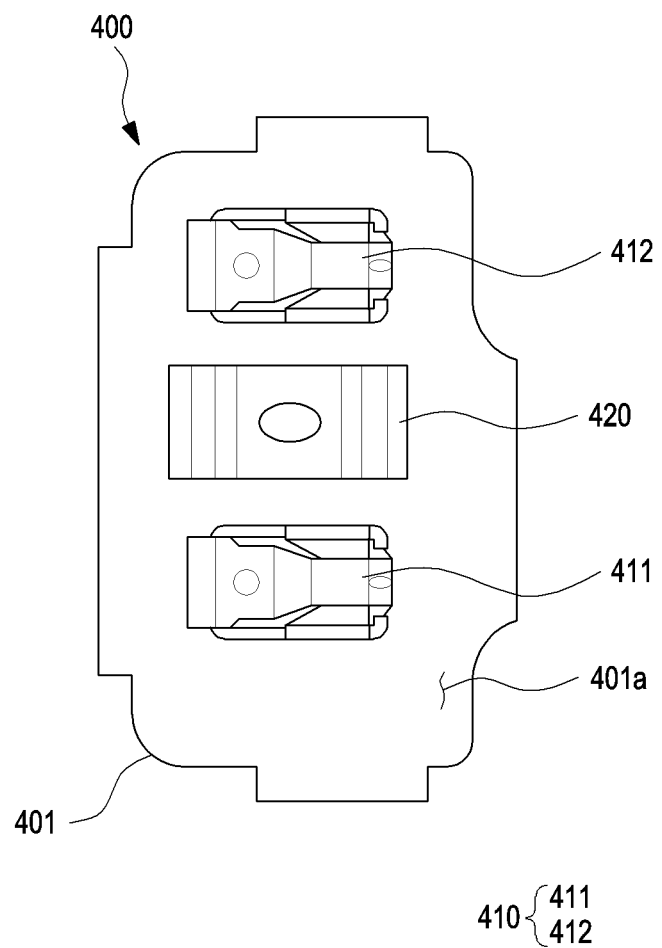
FIG. 11 is a diagram illustrating a second substrate viewed from above a first substrate according to an embodiment.
Figure 12:
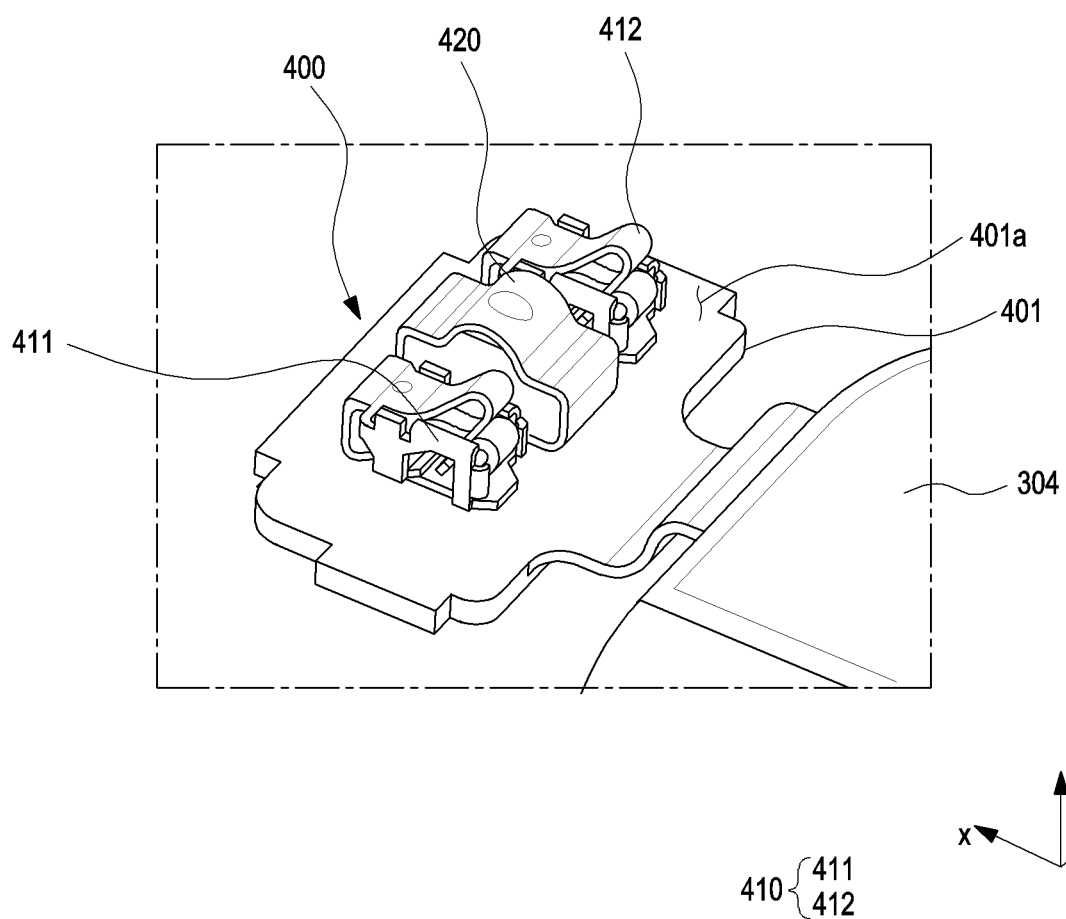
FIG. 12 is a perspective view illustrating a first surface of a second substrate according to an embodiment.

FIG. 11 is a diagram illustrating the first surface 401a of the second substrate 400 viewed from above according to an embodiment. FIG. 12 is a perspective view illustrating the first surface 401a of the second substrate 400 according to an embodiment.

Each of the first contact member 411, the second contact member 412, and the support member 420 may protrude from the first surface 401a of the second substrate 400. When the second substrate 400 is assembled to the housing 300, the first contact member 411 and the second contact member 412 are brought into contact with the conductive portion (e.g., the conductive portion 301 of FIGS. 6, 7 and 8) of the housing. Therefore, the second substrate 400 may be restrained from moving in one direction (the Z-axis direction). According to another embodiment, when the second substrate 400 is assembled to the housing 300, the second substrate 400 may be restrained from moving in two directions (the Z-axis direction and the direction opposite to the X-axis direction) by the support member 420. With reference to the embodiment of FIGS. 13a to 15, the behaviors of the contact member 410 and the support member 420 when the second substrate 400 is assembled to the housing 300 will be described in detail.

Figure 13A:
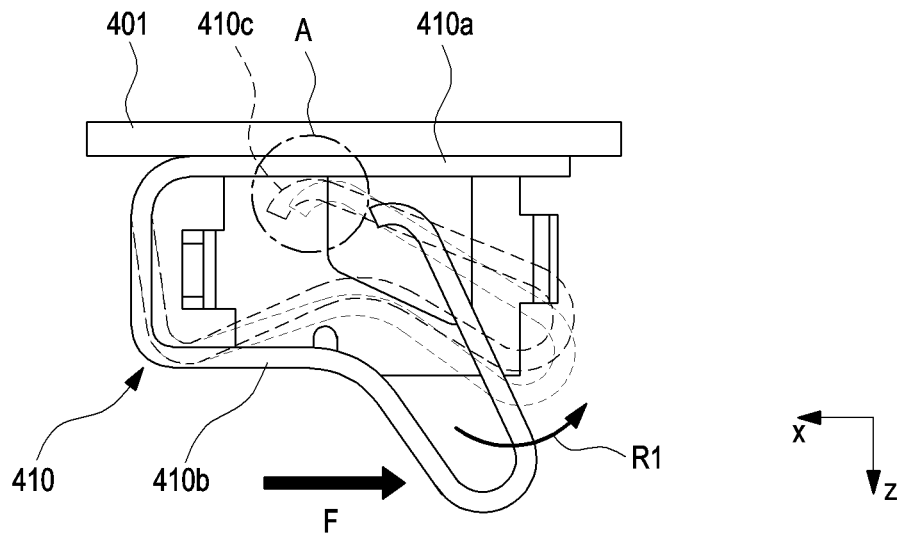
FIG. 13a is a diagram illustrating deformation of a contact member, when an external force is applied to the contact member according to an embodiment.
Figure 13B:
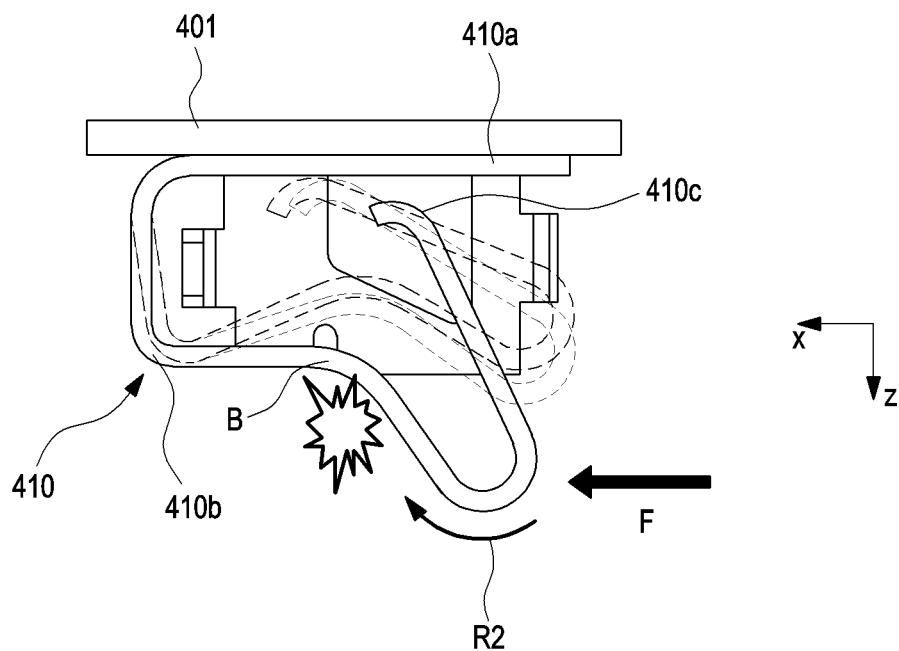
FIG. 13b is a diagram illustrating deformation of a contact member, when an external force is applied to the contact member according to an embodiment.

FIG. 13a is a diagram illustrating deformation of the contact member 410, when an external force is applied to the contact member 410 according to an embodiment. FIG. 13b is a diagram illustrating deformation of the contact member 410, when an external force is applied to the contact member 410 according to an embodiment. FIG. 13a may illustrate deformation of the contact member 410 during assembly of the second substrate 400 to the housing 300. FIG. 13b may illustrate deformation of the contact member 410 during disassembly of the second substrate 400 from the housing 300.

The contact member 410 may be formed to have directionality. For example, the contact member 410 may be designed to be movable in one direction (e.g., the Z-axis direction), with a part of the contact member 410 fixed to the base 401 of the second substrate 400. For example, the contact member 410 may include a first portion 410a that is a fixed end of the base 401, a second portion 410b that is an intermediate portion deformed during compression, and a third portion 410c that is a free end.

Referring to FIG. 13a, when an external force F is applied to the contact member 410 during assembly of the second substrate 400 to the housing 300 (during movement of the second substrate 400 in the X-axis direction), the contact member 410 may be deformed in a direction in which the third portion 410c of the contact member 410 is brought into contact with one surface of the base 401, while moving in a counterclockwise direction R1. In this case, the contact member 410 may be compressed in the direction opposite to the Z axis. For example, in FIG. 13a, when the contact member 410 is compressed approximately 75%, causing the third part 410c to contact the first portion 410a. The foregoing state will now be referred to as State A. In this case, the third portion 410c of the contact member 410 may serve to support the entire contact member 410 and connect an electrical signal. Even when the third portion 410c of the contact member 410 does not come into contact with the first portion 410a, the first portion 410a of the contact member 410 is fixed to one surface of the base 401 and thus an electrical signal may be connected. However, a signal transmission through the first portion 410a may have insufficient speed. When the contact member 410 is compressed so that the third portion 410c of the contact member 410 comes into contact with the first portion 410a, the electrical signal connection may be smoother and the signal transmission speed may increase.

Referring to FIG. 13b, when the external force F is applied in an opposite direction FIG. 13a during disassembly of the second substrate 400 from the housing 300 (during movement of the second substrate 400 in the opposite direction to the X axis), the second part 410b of the contact member 410 may be damaged while moving clockwise R2. For example, the second portion 410b of the contact member 410 may include a bent portion B. When the external force F acts, stress may be concentrated in the bent portion B, thereby damaging the bent portion B. Accordingly, when the second substrate 400 is disassembled from the housing 300, it may be desirable to provide a method of preventing damage to the member.

Figure 14:
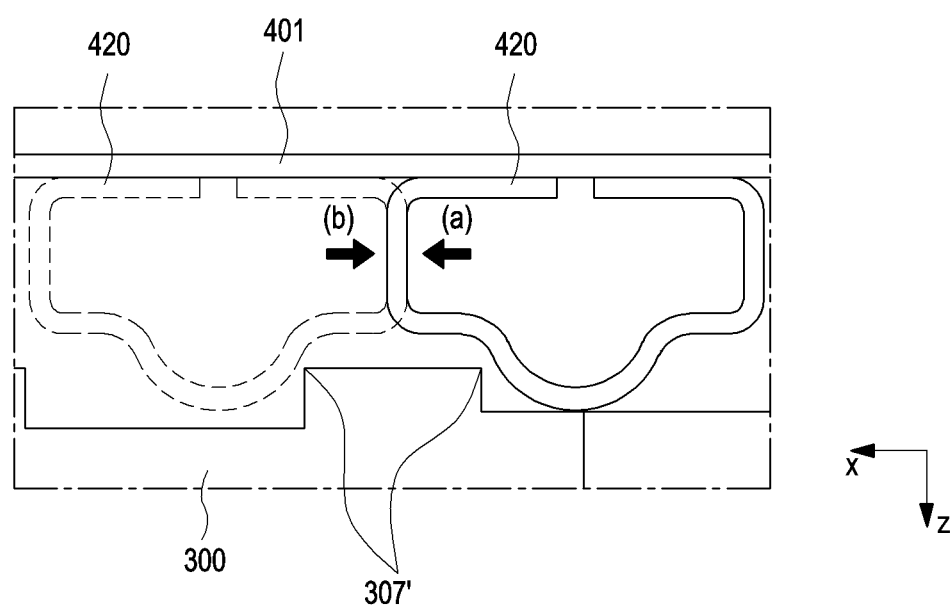
FIG. 14 is a diagram illustrating deformation of a support member, when an external force is applied to the support member according to an embodiment.

FIG. 14 is a diagram illustrating deformation of the support member 420, when an external force is applied to the support member 420 according to an embodiment. (a) of FIG. 14 may illustrate the position of the support member 420 before assembly of the second substrate (e.g., 400) to the housing 300, and (b) of FIG. 14 may illustrate the position of the support member 420 before disassembly of the assembled support member 420 from the housing 300.

The support member 420 may be formed so as not to have directionality during assembly and disassembly, unlike the contact member 410.

Referring to (a) of FIG. 14, the support member 420 may come into contact with a corner 307" of the housing and be damaged during assembly of the second substrate 400 to the housing 300 (during movement of the second substrate 400 in the X-axis direction). Referring to (b) of FIG. 14, the support member 420 may also come into contact with the other corner 307' of the housing 300 and be damaged during disassembly of the second substrate 400 from the housing 300 (during movement of the second substrate 400 in the opposite direction to the X axis).

The electronic device 101 according to an embodiment of the disclosure may include a means for preventing damage to the support member 420 during assembly and disassembly of the support member 420, as illustrated in (a) of FIG. 14 and (b) of FIG. 14.

Figure 15:
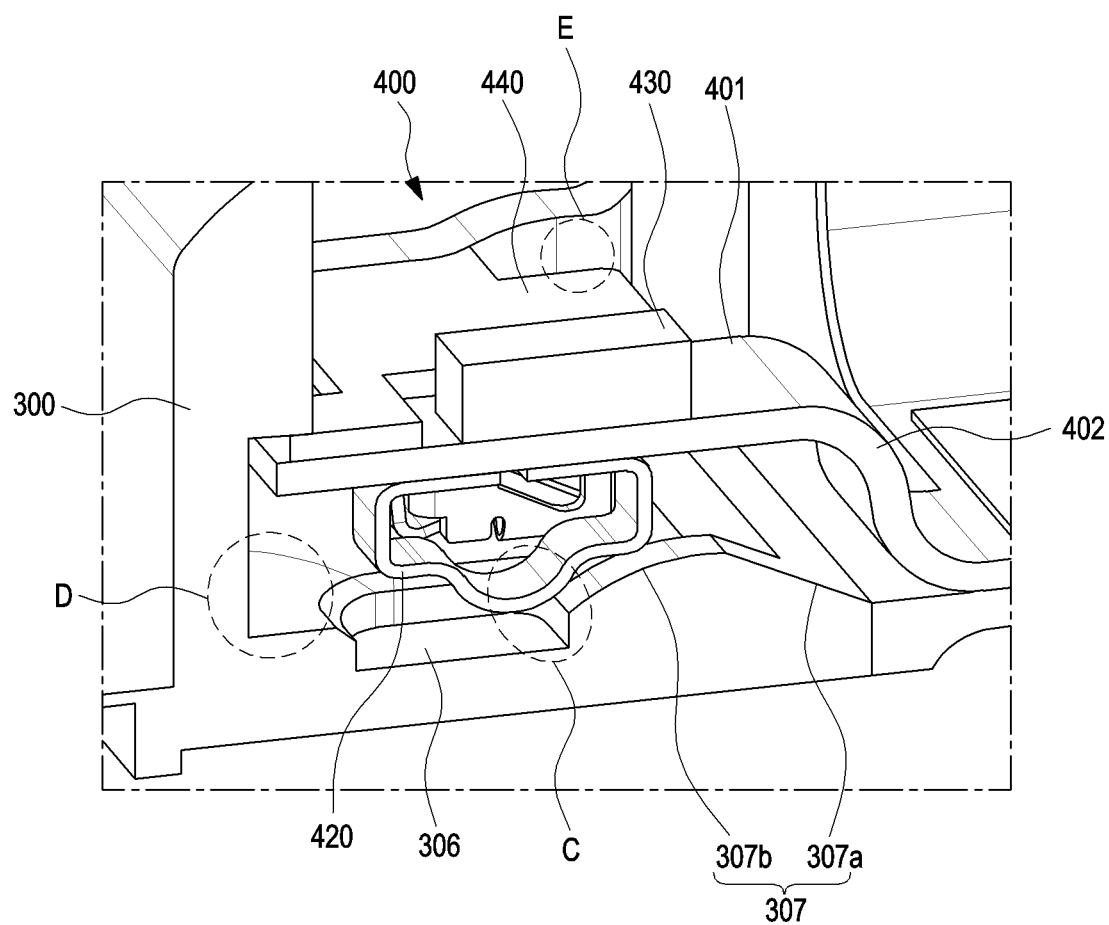
FIG. 15 is a diagram illustrating a structure for reducing damage to a member of an electronic device and improving assembly/disassembly of a second substrate, according to an embodiment.
Figure 16:
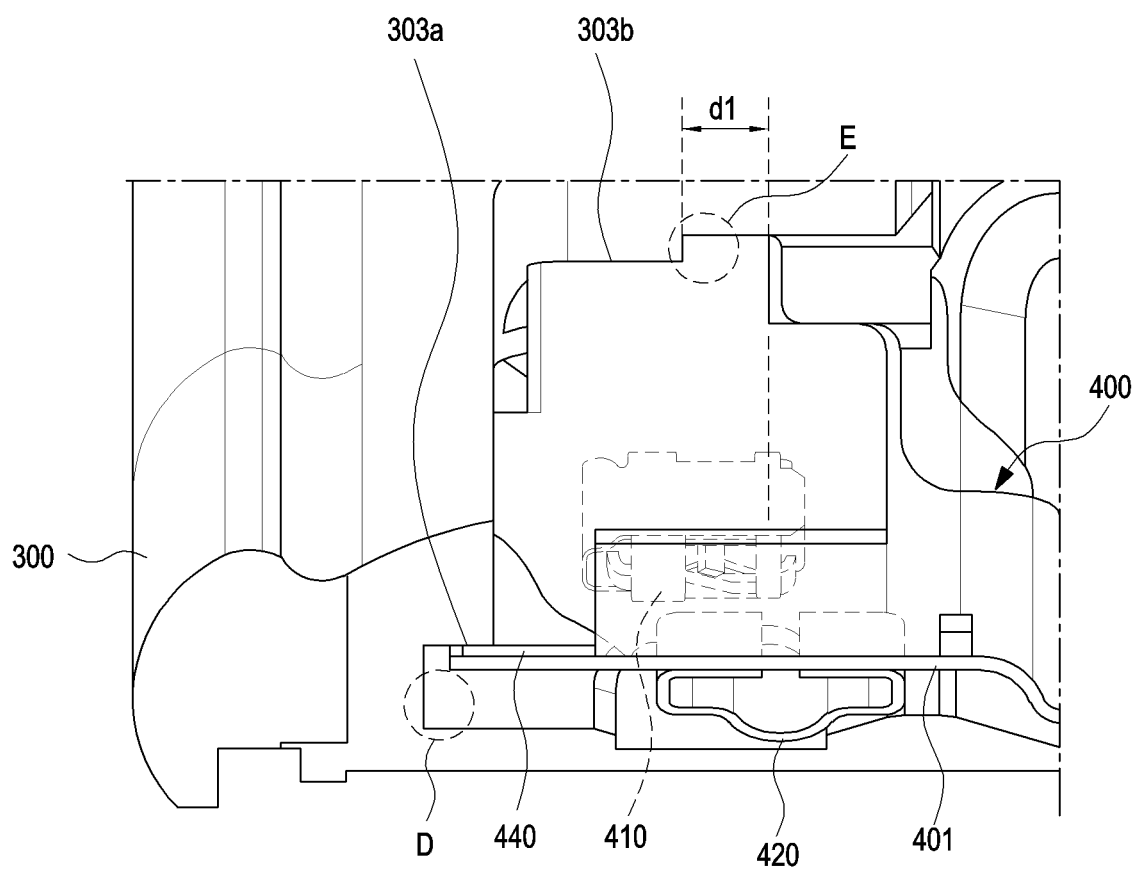
FIG. 16 is a diagram illustrating the structure of FIG. 15 viewed from another direction.
Figure 17A:
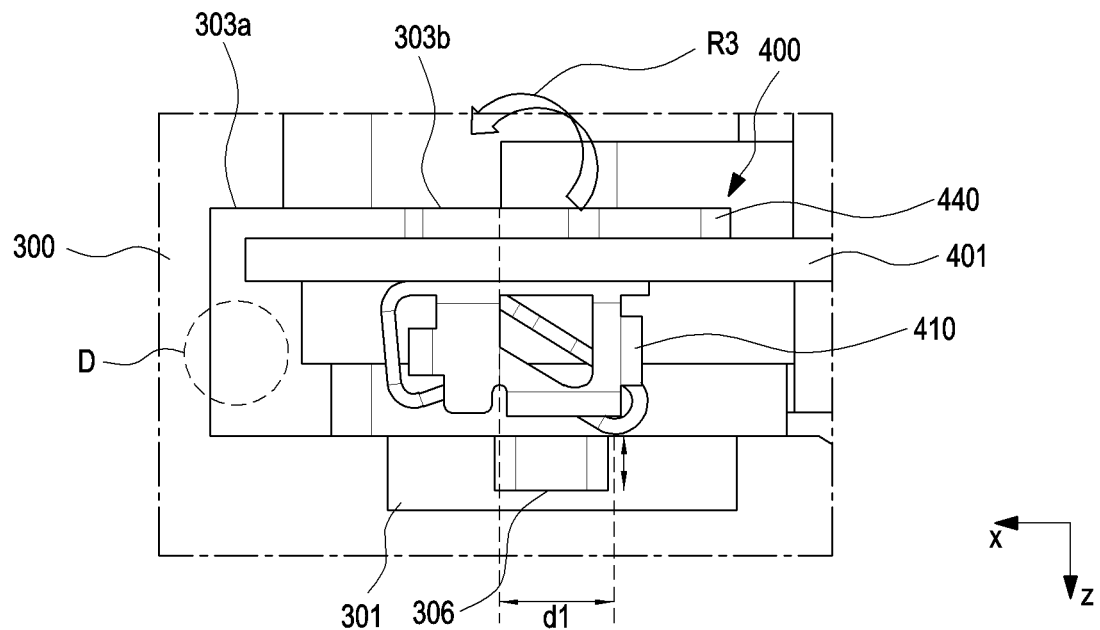
FIG. 17a is a cross-sectional view illustrating a contact member and a support member according to an embodiment.
Figure 17B:
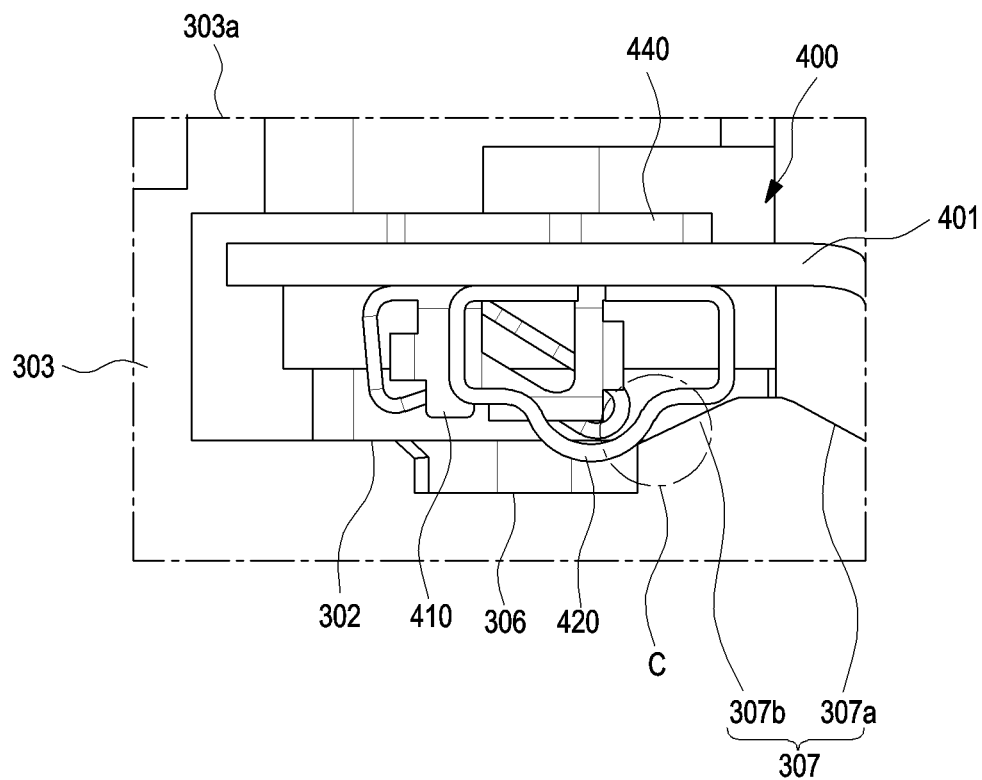
FIG. 17b is a cross-sectional view illustrating a contact member and a support member according to an embodiment.

FIG. 15 is a diagram illustrating a structure for preventing damage to a member of the electronic device 101 and improving assembly/disassembly of the second substrate 400 according to an embodiment. FIG. 16 is a diagram illustrating the structure of FIG. 15 viewed from another direction. FIG. 17a is a diagram illustrating cross-sections of the contact member 410 and the support member 420 according to an embodiment. FIG. 17b is a diagram illustrating cross-sections of the contact member 410 and the support member 420 according to an embodiment.

The electronic device 101 may further include an inclined portion 307. The support member 420 may slide to the housing 300 through a path. The inclined portion 307 may formed in the path. The inclined portion 307 may include a first inclined portion 307a and a second inclined portion 307b. The first inclined portion 307a is contactable to the support member 420 during assembly of the second substrate 400 to the housing 300. The second inclined portion 307b contactable to the support member 420 during disassembly of the second substrate 400 from the housing 300. The second inclined portion 307b may be formed to be kept in contact with a part C of the support member 420. The second inclined portion 307b may be formed to remain in contact with Part C of the support member 420 not only when the second substrate 400 is disassembled from the housing 300, but also when the second substrate 400 is assembled into the housing 300.

The housing 300 may further include a recess 306. The recess 306 prevents direct contact between one end of the support member 420 and the housing 300, when the second substrate 400 is coupled with the housing 300. The inclusion of the recess 306 may prevent permanent deformation of the support member 420, when the housing 300 presses the support member 420. when the support member 420 is coupled with the housing 300 by sliding movement, the support member 420 may keep the part C in contact with at least one portion 307b of the inclined portion 307. The second substrate 400 may be restrained from moving in two directions (in the Z-axis direction and the opposite direction to the X axis in FIGS. 7 and 8) by the part C of the support member 420.

The electronic device 101 may further include a configuration for facilitating assembly/disassembly of the second substrate 400.

For example, as a gap D is formed on the rear surface of a flange (e.g., the flange 403 of FIG. 8) by forming t-cut processed parts for forming a stepped portion (e.g., the stepped portion 303 of FIG. 8) to be deep in the height direction (e.g., the Z-axis direction), the electronic device 101 may secure a movable area of the flange and thus facilitates assembly and disassembly of the second substrate 400. In another example, as a gap E is formed on a side surface of the flange (e.g., the flange 403 of FIG. 8) by forming t-cut processed parts for forming the stepped portion (e.g., the stepped portion 303 of FIG. 8) to be wide, the electronic device 101 may secure a movable area of the flange and thus facilitates assembly and disassembly of the second substrate 400.

Referring to FIGS. 16, 17a and 17b together, a tip of the contact member 410 may be spaced apart from a part where the flange (e.g., the second flange 403b of FIG. 8) of the base 401 starts to engage with the stepped portion 303b by a first distance d1 to facilitate assembly/disassembly of the second substrate 400. As the first distance d1 is secured, damage to the contact member 410 may be prevented during assembly/disassembly of the second substrate 400. However, in the case where the second substrate 400 is spaced by the first distance d1, a pushing force acting in the opposite direction to the Z axis is generated at the tip of the contact member 410, when the second substrate 400 has been assembled to the housing 300. Therefore, as illustrated in FIG. 17a, a rotational force for rotation in one direction R3 may be applied to the second substrate 400. As the part C of the support member 420 comes into contact with the inclined portion 307, the rotational force to the second substrate 400 may be canceled, and the second substrate 400 may be kept in the assembled state to the housing 300, as illustrated in FIG. 17b.

Figure 18:
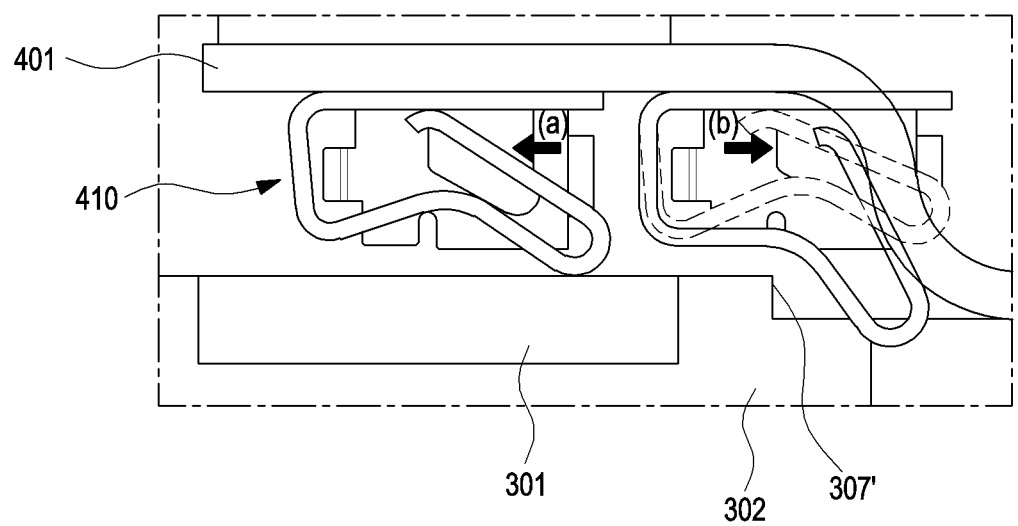
FIG. 18 is a diagram illustrating a behavior of a contact member when the contact member is assembled to or disassembled from a housing of a second substrate according to an embodiment.

FIG. 18 is a diagram illustrating a behavior of the contact member 410 during assembly or disassembly of the second substrate 400 to or from the housing 300 according to an embodiment.

Referring to FIGS. 13a, 13b and 18 together, the contact member 410 may be compressed by about 75% in a state (a) in which the second substrate 400 is assembled to the housing 300. In this case, the third portion 410c of the contact member 410 may come into contact with the first portion 410a. In a state (b) in which the second substrate 400 is disassembled from the housing 300, the third portion 410c of the contact member 410 may be spaced apart from the first portion 410a of the contact member 410. When the second substrate 400 is assembled and then disassembled, an elastic repulsive force may be applied to the third portion 410c in contact with the first portion 410a, and thus the third portion 410c may be spaced from the first portion 410a. In this case, the third portion 410c may come into contact with the one corner 307' of the housing 300, thus being damaged.

In consideration of the behavior of the contact member 410 as described above, a structure for preventing damage to the contact member 410 will be described in detail below with reference to FIGS. 19 to 22.

Figure 19:
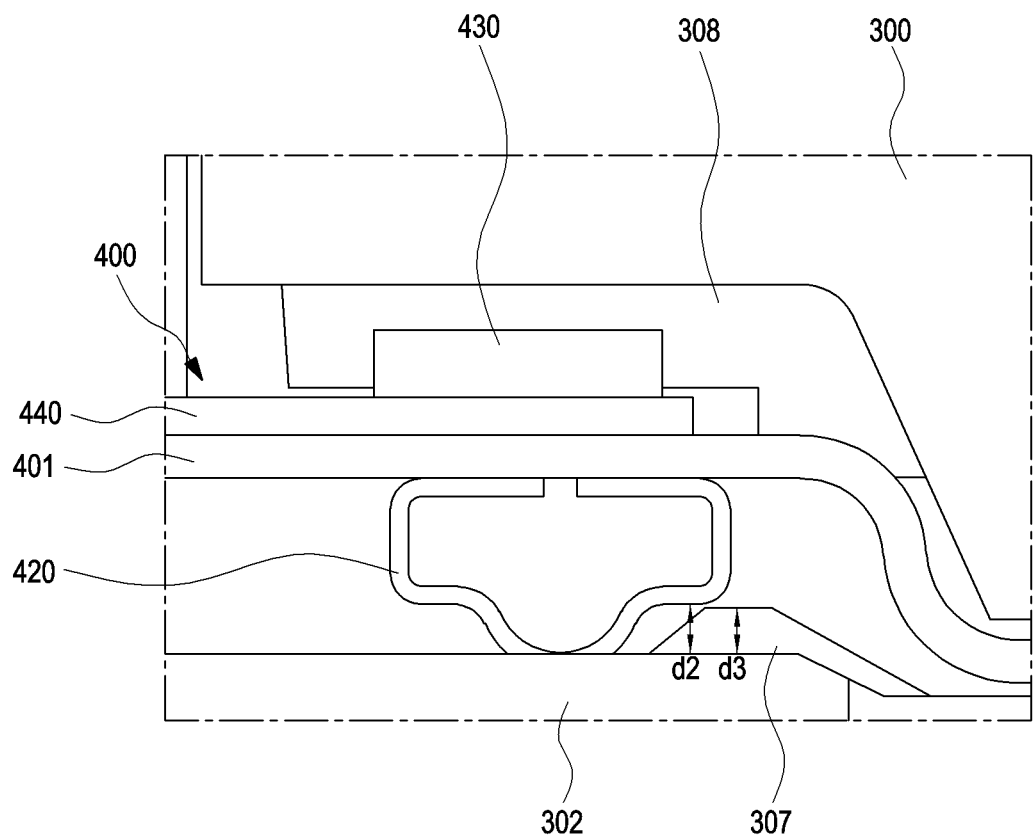
FIG. 19 is a side view illustrating a support member in a state in which a second substrate is assembled to a housing according to an embodiment.
Figure 20:
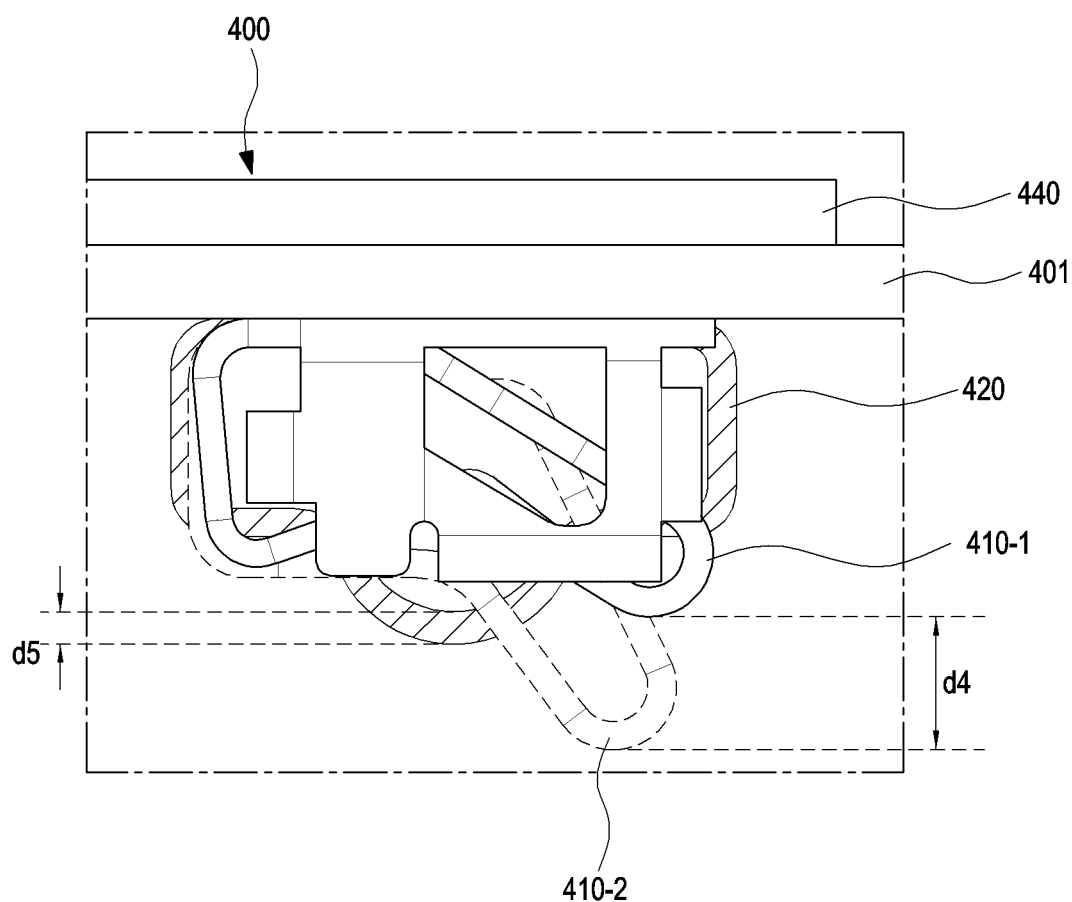
FIG. 20 is a diagram comparing behaviors of a contact member and a support member during assembly to or disassembly from a housing of a second substrate according to an embodiment.
Figure 21:
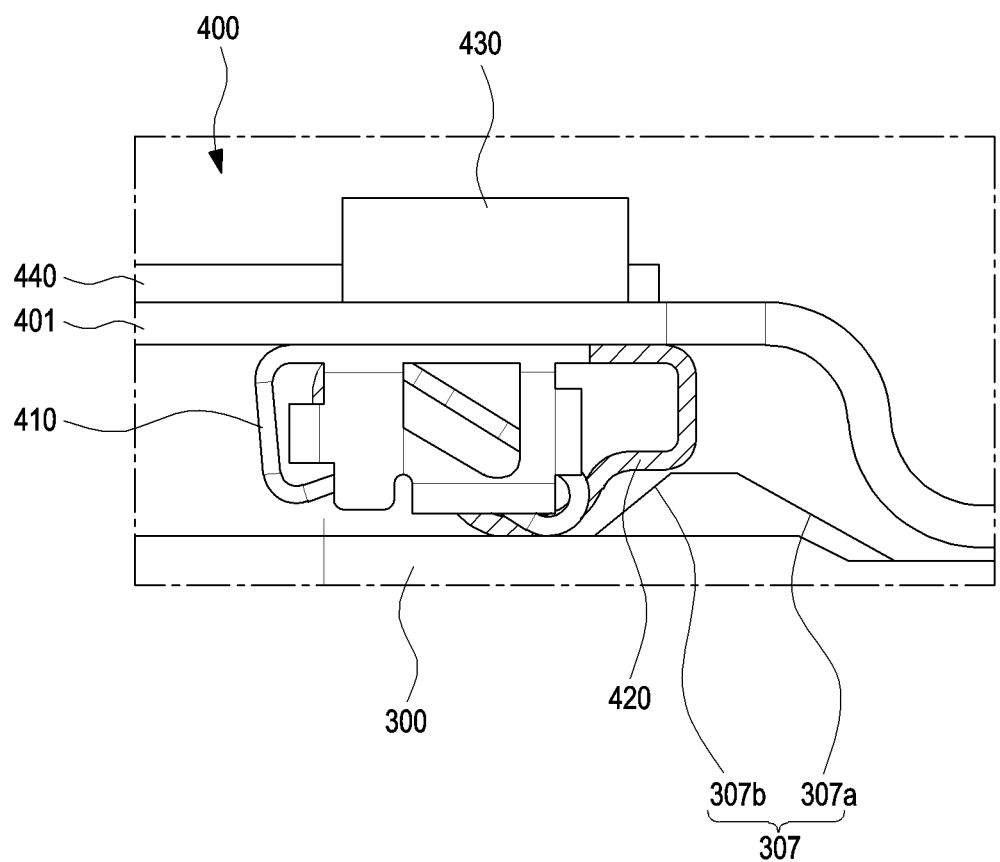
FIG. 21 is a side view illustrating a contact member and a support member in a state in which a second substrate is assembled to a housing according to an embodiment.
Figure 22:
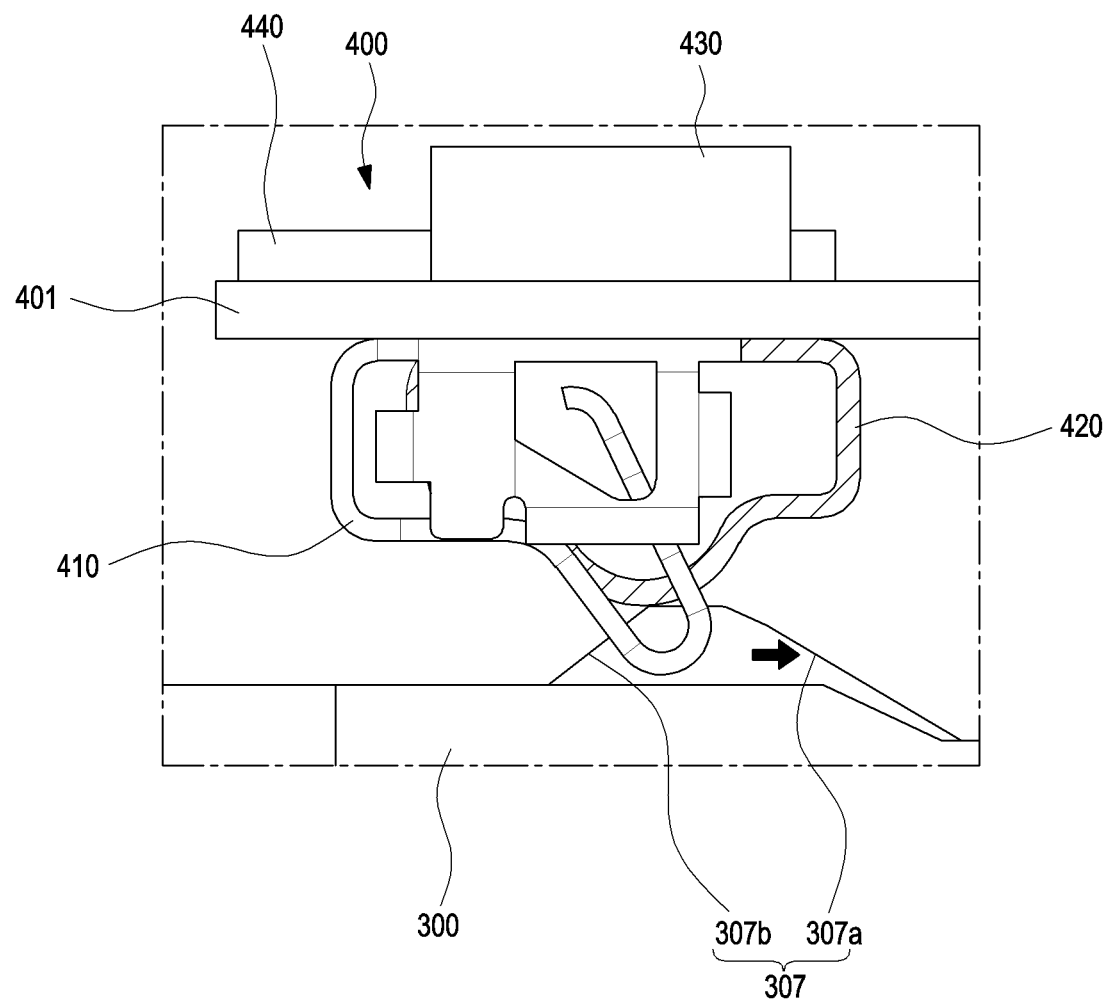
FIG. 22 is a side view illustrating positions of a contact member and a support member when a second substrate is disassembled from a housing according to an embodiment.

FIG. 19 is a side view illustrating the support member 420 in a state in which the second substrate 400 is assembled to the housing 300 according to an embodiment. FIG. 20 is a diagram comparing behaviors between the contact member 410 and the support member 420 when the second substrate 400 is assembled to or disassembled from the housing 300 according to an embodiment. FIG. 21 is a side view illustrating the contact member 410 and the support member 420 in a state in which the second substrate 400 is assembled to the housing 300 according to an embodiment. FIG. 22 is a side view illustrating the positions of the contact member 410 and the support member 420, when the second substrate 400 is disassembled from the housing 300 according to an embodiment.

The contact member 410 may be grounded with the conductive portion 301 of the housing 300 in a state in which the second substrate 400 is assembled to the housing 300, for example, in a compressed state of about 75%. In addition, the support member 420 may move along the inclined portion 307 in the process of assembling or disassembling the second substrate 400 to or from the housing 300.

Referring to FIG. 19, in a state in which the second substrate 400 is assembled to the housing 300, the support member 420 may be spaced apart from a surface (the conductive portion 301) to which the contact member 410 is grounded by a second distance d2. In addition, in the state in which the second substrate 400 is assembled to the housing 300, the apex of the inclined portion 307 and the surface to which the contact member 410 is grounded (the conductive portion 301) may be spaced apart from each other by a third distance d3. The second distance d2 may be greater than the third distance d3. When the second distance d2 is equal to or less than the third distance d3, the support member 420 may be interfered and thus may not move smoothly during assembly or disassembly of the second substrate 400 to or from the housing 300.

Referring to FIG. 20, the contact member 410 may have a height difference as much as a fourth distance d4 between an about 75% compressed state 410-1 and an about 0% compressed state 420-2. The support member 420 may be deformed by as much as a fifth distance d5 during assembly or disassembly of the second substrate 400 to or from the housing 300.

Referring to FIGS. 19 and 20 together, according to an embodiment, the distance between the apex of the inclined portion 307 and the contact member 410, that is, the third distance d3 in the assembled state of the second substrate 400 to the housing 300 may be greater than the sum of the fourth distance d4 and the fifth distance d5. When the third distance d3 is equal to or less than the sum of the fourth distance d4 and the fifth distance d5, the bent portion (e.g., the bent portion B of FIG. 13b) may be damaged during movement in the direction opposite to the X axis because the contact member 410 has directionality in the X-axis direction.

As described above, when the dimensions of each element between the contact member 410 and the support member 420 have been set, the contact member 410 and the support member 420 may behave in the process of assembling or disassembling the second substrate 400 to or from the housing 300 as in the embodiment illustrated in FIGS. 21 and 22. Referring to FIG. 21, with the second substrate 400 assembled to the housing 300, the contact member 410 may be kept in contact with the conductive portion 301. Referring to FIG. 22, when the second substrate 400 is disassembled from the housing 300, the contact member 410 may be released from the contact with the conductive portion 301 through slide-up of the support member 420 along the inclined portion 307, and the compression ratio may become approximately 0%. Through this configuration, damage to the contact member 410 may be prevented during disassembly of the second substrate 400 from the housing 300.

Referring back to FIG. 19, the electronic device 101 may further include a guide member 308 stacked adjacent to one surface of the second substrate 400 in the state in which the second substrate 400 is assembled to the housing 300. When the electronic device 101 is completely assembled into a finished product, the guide member 308 may perfectly restrain the second substrate 400 and prevent the second substrate 400 from slipping off by an impact such as a fall of the electronic device 101.

Figure 23:
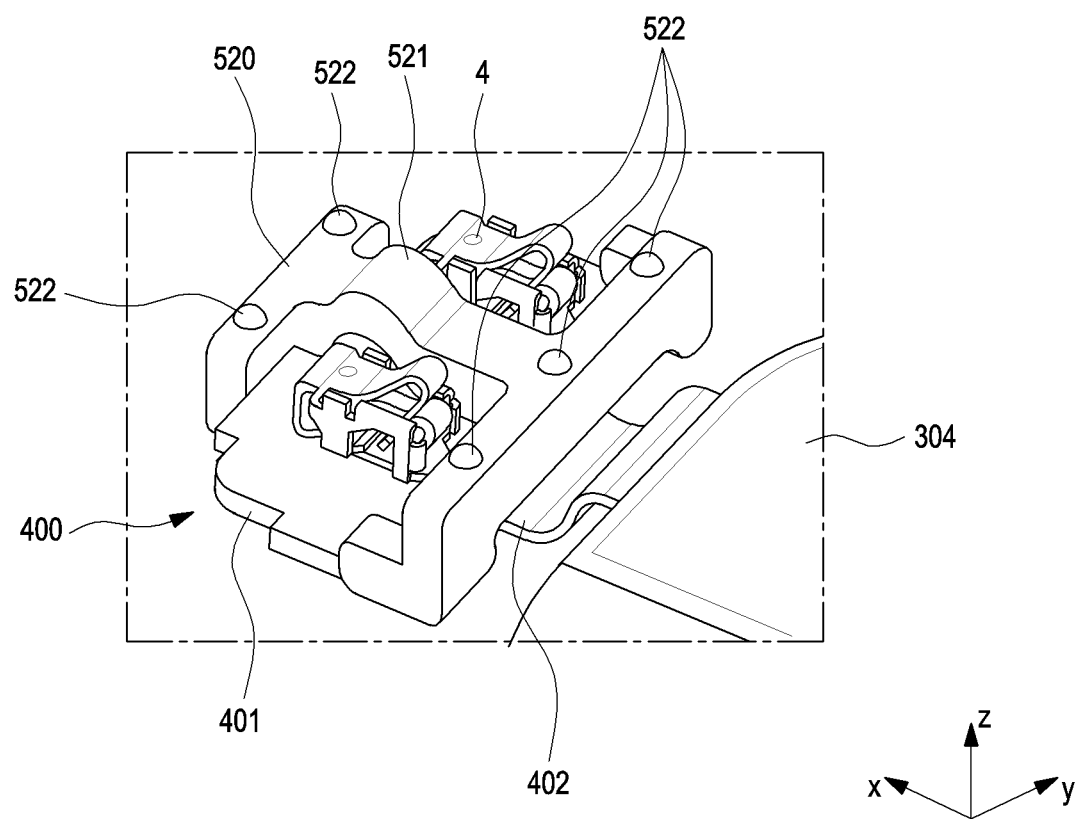
FIG. 23 is a diagram one surface of a second substrate including a support member according to another embodiment of the disclosure.
Figure 24:
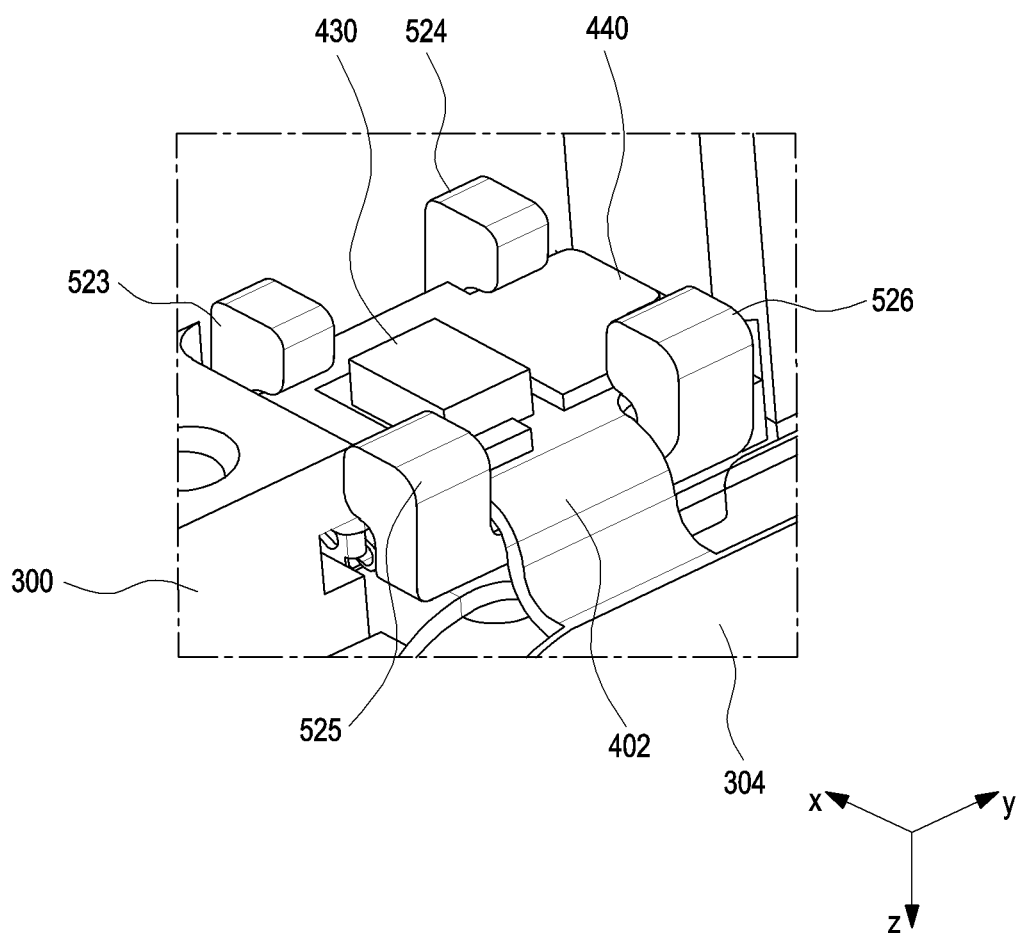
FIG. 24 is a diagram illustrating a state in which a second substrate including a support member is assembled to a housing according to another embodiment of the disclosure.

FIG. 23 is a diagram illustrating one surface of the second substrate 400 including a support member 520 according to another embodiment of the disclosure. FIG. 24 is a diagram illustrating the second substrate 400 including the support member 520, which has been assembled to the housing 300 according to another embodiment of the disclosure.

According to another embodiment of the disclosure, the support member 520 (hereinafter, 'injection-type support member 520') having an injection-type bracket structure which is partially formed in the shape of 'D', which is not a metallic member, may be provided.

As illustrated in FIG. 23, the injection-type support member 520 may include a contact portion 521 formed in the shape of 'D', located at the center of the support member 520, and contacting the non-conductive portion 302 or the inclined portion 307 of the housing. The injection-type support member 520 may further include protrusions 522 for supporting a load in the height direction of the contact member 410. To minimize friction in the injection-type support member 520, the protrusions 522 protruding from parts of the support member 520 may be applied, rather than the entire surface of the injection-type support member 520 contacts.

The injection-type support member 520 may be disposed on one surface of the second substrate 400 (e.g., the first surface 401a of FIGS. 6 to 8) as illustrated in FIG. 23, and may also be partially disposed on the other surface of the second substrate 400 (e.g., the second surface 401b of FIGS. 6 to 8) as illustrated in FIG. 24. For example, the injection-type support member 520 may include at least one hook portion 523, 524, 525, and 526 surrounding at least a part of the second substrate 400, and the at least one hook portion 523, 524, 525, and 526 may serve to restrain the second substrate 420 in the X-axis, Y-axis, and/or Z-axis direction.

The support member 420 may be formed by processing a metal plate spring in the shape of 'D'. When the support member 420 is pressed in a specific direction, the support member 420 may be elastically compressed. When a pressing force is released, the support member 420 may be restored to its original state. Otherwise, according to another embodiment, the injection-type support member 520 may not be a metallic member, and may have an injection-type bracket structure partially formed in the shape of 'D'. The injection-type bracket structure will be described later with reference to other drawings.

As described above, according to an embodiment of the disclosure, even when a user grips or touches an electronic device, the degradation of antenna performance may be reduced. Further, according to an embodiment of the disclosure, as a board including a stepped portion of a housing and a flange fixable to the stepped portion of the housing, without a fastening member such as a screw is disclosed, a larger space may be secured to arrange components in the electronic device. Further, according to an embodiment, damage to a component of a fastening structure may advantageously be prevented.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, an electronic device (the electronic device 101 of FIG. 6) may include a housing (e.g., the housing 300 of FIG. 6) including a conductive portion (e.g., the conductive portion 301 of FIG. 6) and a non-conductive portion (e.g., the non-conductive portion 302 of FIG. 6); a first substrate (e.g., the first substrate 304 of FIG. 4); at least one electronic component disposed on the first substrate; a second substrate (e.g., the second substrate 400 of FIG. 4) electrically coupled to the first substrate, the second substrate including a first surface (e.g., the first surface 401a of FIG. 6) facing a first direction and a second surface (e.g., the second surface 401b of FIG. 6) facing a second direction opposite to the first direction, and electrically coupled to the first substrate; at least one contact member (e.g., the contact member 410 of FIG. 6) disposed between the first surface of the second substrate and the conductive portion of the housing; and a support member (e.g., the support member 420 of FIG. 6) disposed between the first surface of the second substrate and the non-conductive portion of the housing.

According to an embodiment, the at least one contact member may be formed as a C-clip.

According to an embodiment, the support member may have the shape of a metal plate spring, and may be disposed substantially in parallel with the contact member in a third direction substantially perpendicular to the first direction and the second direction.

According to an embodiment, the at least one contact member may include a first contact member and a second contact member disposed substantially in parallel with the first contact member.

According to an embodiment, the support member may be disposed between the first contact member and the second contact member.

According to an embodiment, a recess may be formed at a position corresponding to the support member in the non-conductive portion of the housing.

According to an embodiment, the support member slides in a path to the housing, and wherein the electronic device may further include an inclined portion formed in the path.

According to an embodiment, the support member may be configured to be kept in contact with at least a part of the inclined portion, when the support member slides to the housing and is coupled with the housing.

According to an embodiment, the electronic device may further include a grip sensor disposed on the second surface of the second substrate.

According to an embodiment, the conductive portion may include a plurality of mutually insulated portions (e.g., 301a, 301b, 301c, and 301d in FIG. 3), and the electronic device may further include a control circuit. The control circuit is configured to couple at least two (e.g., 301a and 301b in FIG. 3) of the plurality of mutually insulated portions to each other based on information about a user's grip, obtained from the grip sensor.

According to an embodiment, at least a part of the second substrate may face a stepped portion formed in the housing, movement of the second substrate is prevented by the stepped portion.

According to an embodiment, the second surface of the second substrate faces the stepped portion.

According to an embodiment, a reinforcement member may be disposed on the second surface of the second substrate.

According to an embodiment, the second substrate may be formed to face the stepped portion at three different parts and is restrained or fixed by the stepped portion.

According to an embodiment, the second substrate may be an FPCB.

According to an embodiment of the disclosure, an electronic device may include a housing including a plurality of conductive portions and a non-conductive portion; a first substrate; at least one electronic component disposed on the first substrate; a second substrate electrically coupled to the first substrate overlapping at least two of the plurality of conductive portions; a grip sensor disposed on the second substrate and configured to sense a user's grip of the electronic device; and a control circuit. The control circuit may be configured to couple at least two mutually insulated portions of the plurality of conductive portions to each other based on information from the grip sensor.

According to an embodiment, the electronic device may further include at least one contact member disposed between the surface of the second substrate and the plurality of conductive portions; and a support member disposed between the surface of the second substrate and the non-conductive portion of the housing.

According to an embodiment, at least a part of the second substrate may face a stepped portion formed in the housing, wherein movement of the second substrate may be prevented by the stepped portion.

According to an embodiment of the disclosure, an electronic device may include a housing including a conductive portion and a non-conductive portion; a first substrate; at least one electronic component disposed on the first substrate; a second substrate including a surface facing a first direction and a second surface facing a second direction opposite to the first direction, the second substrate electrically coupled to the first substrate; at least one contact member disposed between the first surface of the second substrate and the conductive portion of the housing; and a support member disposed between the first surface of the second substrate and the non-conductive portion of the housing. At least a part of the second surface of the second substrate may face a stepped portion formed in the housing, and movement in the second direction of the second surface of the second substrate may be prevented by the stepped portion.

According to an embodiment, a reinforcing member may be disposed on the second surface of the second substrate.

While specific embodiments of the disclosure have been described above, it will be apparent to those skilled in the art that many modifications can be made without departing from the scope of the disclosure.

The invention claimed is:
1. An electronic device comprising:
a housing including a conductive portion and a non-conductive portion;
a first substrate;
at least one electronic component disposed on the first substrate;
a second substrate electrically coupled to the first substrate, the second substrate including a first surface facing a first direction and a second surface facing a second direction opposite to the first direction;
at least one contact member disposed between the first surface of the second substrate and the conductive portion of the housing; and
a support member disposed between the first surface of the second substrate and the non-conductive portion of the housing.

2. The electronic device of claim 1, wherein the at least one contact member is formed as a C-clip.

3. The electronic device of claim 1, wherein the support member has a shape of a metal plate spring, and is disposed substantially in parallel with the at least one contact member in a third direction substantially perpendicular to the first direction and the second direction.

4. The electronic device of claim 1, wherein the at least one contact member includes a first contact member and a second contact member disposed substantially in parallel with the first contact member.

5. The electronic device of claim 4, wherein the support member is disposed between the first contact member and the second contact member.

6. The electronic device of claim 1, wherein a recess is formed at a position corresponding to the support member in the non-conductive portion of the housing.

7. The electronic device of claim 6, wherein the support member slides in a path to the housing, and wherein the electronic device further comprises an inclined portion formed in the path.

8. The electronic device of claim 7, wherein the support member is configured to be kept in contact with at least a part of the inclined portion, when the support member slides to the housing and is coupled with the housing.

9. The electronic device of claim 1, further comprising a grip sensor disposed on the second surface of the second substrate.

10. The electronic device of claim 9, wherein the conductive portion includes a plurality of mutually insulated portions,
wherein the electronic device further comprises a control circuit, and
wherein the control circuit is configured to couple at least two of the plurality of mutually insulated portions to each other based on information about a user's grip, obtained from the grip sensor.

11. The electronic device of claim 1, wherein at least a part of the second substrate faces a stepped portion formed in the housing, movement of the second substrate is prevented by the stepped portion.

12. The electronic device of claim 11, wherein the second surface of the second substrate faces the stepped portion.

13. The electronic device of claim 11, wherein a reinforcement member is disposed on the second surface of the second substrate.

14. The electronic device of claim 11, wherein the second substrate is faces the stepped portion at three different parts and is restrained or fixed by the stepped portion.

15. The electronic device of claim 1, wherein the second substrate comprises a flexible printed circuit board (FPCB).

16. An electronic device comprising:
a housing including a plurality of conductive portions and a non-conductive portion;
a first substrate;
at least one electronic component disposed on the first substrate;

a second substrate electrically coupled to the first substrate and overlapping at least two of the plurality of conductive portions;

a grip sensor disposed on the second substrate and configured to sense a user's grip of the electronic device; and a control circuit, wherein the control circuit is configured to couple at least two mutually insulated portions of the plurality of conductive portions to each other based on information about a user's grip, obtained from the grip sensor.

17. The electronic device of claim 16, further comprising:

at least one contact member disposed between the first surface of the second substrate and the plurality of conductive portions; and a support member disposed between the first surface of the second substrate and the non-conductive portion of the housing.

18. The electronic device according to claim 16, wherein at least a part of the second substrate faces a stepped portion formed in the housing, wherein movement of the second substrate is prevented by the stepped portion.

19. An electronic device comprising:

a housing including a conductive portion and a non-conductive portion;

a first substrate;

at least one electronic component disposed on the first substrate;

a second substrate including a first surface facing a first direction and a second surface facing a second direction opposite to the first direction, the second substrate electrically coupled to the first substrate;

at least one contact member disposed between the first surface of the second substrate and the conductive portion of the housing; and a support member disposed between the first surface of the second substrate and the non-conductive portion of the housing, wherein at least a part of the opposite surface of the second substrate faces a stepped portion formed in the housing, and movement in the second direction of the second surface of the second substrate is prevented by the stepped portion.

20. The electronic device of claim 19, wherein a reinforcing member is disposed on the second surface of the second substrate.

* * * * *